United States Patent
Nakamura et al.

(10) Patent No.: US 9,437,507 B2
(45) Date of Patent: Sep. 6, 2016

(54) METHOD OF CORRECTING FILM THICKNESS MEASUREMENT VALUE, FILM THICKNESS CORRECTOR AND EDDY CURRENT SENSOR

(71) Applicant: EBARA CORPORATION, Tokyo (JP)

(72) Inventors: Akira Nakamura, Tokyo (JP); Hiroaki Shibue, Tokyo (JP); Yasumasa Hiroo, Tokyo (JP); Hiroshi Ota, Tokyo (JP); Taro Takahashi, Tokyo (JP); Mitsuo Tada, Tokyo (JP)

(73) Assignee: Ebara Corporation, Tokyo (JP)

( * ) Notice: Subject to any disclaimer, the term of this patent is extended or adjusted under 35 U.S.C. 154(b) by 8 days.

(21) Appl. No.: 14/656,429

(22) Filed: Mar. 12, 2015

(65) Prior Publication Data
US 2015/0262893 A1 Sep. 17, 2015

(30) Foreign Application Priority Data

Mar. 12, 2014 (JP) .................... 2014-048671
Mar. 13, 2014 (JP) .................... 2014-049622

(51) Int. Cl.
| | |
|---|---|
| *B24B 49/00* | (2012.01) |
| *G01B 7/06* | (2006.01) |
| *H01L 21/66* | (2006.01) |
| *B24B 37/013* | (2012.01) |
| *B24B 49/10* | (2006.01) |

(52) U.S. Cl.
CPC ............. *H01L 22/26* (2013.01); *B24B 37/013* (2013.01); *B24B 49/105* (2013.01); *G01B 7/105* (2013.01); *H01L 22/14* (2013.01)

(58) Field of Classification Search
CPC ... B24B 37/013; B24B 49/105; G01B 7/105; H01L 22/14

USPC .................... 451/5, 6, 41, 285-290
See application file for complete search history.

(56) References Cited

U.S. PATENT DOCUMENTS

| | | | | |
|---|---|---|---|---|
| 5,559,428 A | * | 9/1996 | Li ............................ | G01B 7/10 324/671 |
| 6,707,540 B1 | * | 3/2004 | Lehman ................. | G01N 27/72 324/230 |
| 7,112,960 B2 | * | 9/2006 | Miller ................. | B24B 37/0213 324/228 |
| 7,258,595 B2 | * | 8/2007 | Tada ........................ | B24B 49/10 156/345.14 |

(Continued)

FOREIGN PATENT DOCUMENTS

| | | |
|---|---|---|
| JP | 2005-121616 A | 5/2005 |
| JP | 2009-500829 A | 1/2009 |

(Continued)

*Primary Examiner* — George Nguyen
(74) *Attorney, Agent, or Firm* — Baker & Hostetler LLP

(57) ABSTRACT

The polishing process includes a first state where an eddy current sensor and a polishing target object do not face each other and a second state where the eddy current sensor and the polishing target object face each other. The method of correcting a film thickness measurement value includes obtaining a first measurement signal (Xout, Yout) output from the eddy current sensor in the first state (step S108), computing a correction value (ΔX, ΔY) on the basis of the obtained first measurement signal and a reference signal (Xsd, Ysd) set in advance, obtaining a second measurement signal (X, Y) output from the eddy current sensor in the second state (step S104), and correcting the obtained second measurement signal on the basis of the computed correction value while the polishing process is being performed (step S105).

17 Claims, 28 Drawing Sheets

(56) References Cited

U.S. PATENT DOCUMENTS

| | | | | |
|---|---|---|---|---|
| 7,508,201 B2* | 3/2009 | Tada | ................. | G01B 7/105 |
| | | | | 324/229 |
| 7,670,206 B2* | 3/2010 | Togawa | ................ | B24B 37/013 |
| | | | | 324/229 |
| 7,821,257 B2* | 10/2010 | Fujita | ................... | B24B 37/013 |
| | | | | 324/229 |
| 7,830,141 B2* | 11/2010 | Fujita | ................... | G01B 7/105 |
| | | | | 324/229 |
| 9,281,253 B2* | 3/2016 | Xu | ........................ | H01L 22/14 |
| 2007/0001670 A1 | 1/2007 | Bailey, III | | |
| 2009/0104847 A1* | 4/2009 | Kobayashi | ............ | B24B 37/042 |
| | | | | 451/5 |
| 2013/0065493 A1* | 3/2013 | Takahashi | ............. | B24B 37/013 |
| | | | | 451/59 |
| 2013/0273814 A1* | 10/2013 | Kobayashi | ............ | H01L 21/302 |
| | | | | 451/6 |
| 2015/0262893 A1* | 9/2015 | Nakamura | .............. | H01L 22/26 |
| | | | | 438/10 |

FOREIGN PATENT DOCUMENTS

| | | |
|---|---|---|
| JP | 2013-036881 A | 2/2013 |
| WO | WO 2007/005387 A2 | 1/2007 |
| WO | WO 2007-005387 A2 | 1/2007 |

* cited by examiner

METHOD OF CORRECTING FILM THICKNESS MEASUREMENT VALUE, FILM THICKNESS CORRECTOR AND EDDY CURRENT SENSOR

CROSS-REFERENCE TO RELATED APPLICATION

This application is based upon and claims the benefit of priority of the prior Japanese Patent Application No. 2014-048671, filed on Mar. 12, 2014, and Japanese Patent Application No. 2014-049622, filed on Mar. 13, 2014, the entire contents of which are incorporated herein by reference.

TECHNICAL FIELD

The present invention relates to a method of correcting a film thickness measurement value, a film thickness corrector and an eddy current sensor.

BACKGROUND ART

In recent years, as semiconductor devices have had higher integration and higher density, wiring of circuits has become further finer and the number of layers of multilayer wiring has increased. In order to realize multilayer wiring while realizing finer circuits, it is necessary to perform planarization processing on surfaces of semiconductor devices with high accuracy.

As a technique for planarizing surfaces of semiconductor devices, CMP (Chemical Mechanical Polishing) is known. A polishing device for performing CMP is provided with a polishing table to which a polishing pad is attached and a top ring for holding an object to be polished (a substrate such as a semiconductor wafer or any of various films formed on a surface of a substrate) (hereinafter, referred to as "polishing target object"). The polishing device polishes the polishing target object by pressing on the polishing pad the polishing target object held by the top ring while rotating the polishing table.

The polishing device is being widely used in a polishing process in which an electrically conductive film such as a barrier film or a metal film formed on a surface of a substrate is polished. Detection of an end point of the polishing process and determination of a change in polishing conditions during polishing are performed on the basis of the thickness of the conductive film. Therefore, the polishing device is ordinarily provided with a film thickness detector for detecting the thickness of the conductive film during polishing. A typical example of the film thickness detector is an eddy current sensor.

The eddy current sensor is disposed in the polishing table and rotates with the rotation of the polishing table. The eddy current sensor has a coil connected to an alternating current power supply. The eddy current sensor generates a magnetic field by the coil while passing below the polishing target object with the rotation of the polishing table. An eddy current is thereby induced in the conductive film of the polishing target object. The magnitude of the eddy current changes according to the resistance of the conductive film, i.e., the film thickness of the conductive film. The eddy current sensor is arranged to detect the thickness of the conductive film from a change in the magnetic field generated by the eddy current induced in the conductive film.

While the polishing target object is being polished, heat is generated by friction between the polishing target object and the polishing pad. The output from the eddy current sensor possibly drifts due to an increase in ambient temperature around the eddy current sensor caused by the heat.

It is known that, in a first conventional technique as disclosed in National Publication of International Patent Application No. 2009-500829, a temperature sensor is provided around the eddy current sensor and temperature drift of the eddy current sensor is corrected according to the temperature detected by the temperature sensor.

It is also known that, in a second conventional technique as disclosed in Japanese Patent Laid-Open No. 2013-36881 and Japanese Patent Laid-Open No. 2005-121616, an amount of correction with respect to temperature drift is obtained by using an output signal from the eddy current sensor issued when the polishing target object is not present above the eddy current sensor.

The eddy current sensor is disposed in a hole formed in the polishing table and is opposed to the polishing target object, with the polishing pad interposed therebetween. The eddy current sensor has a sensor coil including an excitation coil and a detection coil. The excitation coil is connected to an alternating current power supply and produces a magnetic field, thereby inducing an eddy current in the polishing target object, e.g., a conductive film. The magnitude of the eddy current changes according to the resistance of the polishing target object, i.e., the film thickness of the polishing target object. With the detection coil, the thickness of the polishing target object is detected from a change in a magnetic field generated by the eddy current induced in the polishing target object. The eddy current sensor is used not only to measure the thickness of the polishing target object but also to measure the distance from the eddy current sensor to a measurement target object. That is, since the magnitude of the eddy current induced in the measurement target object changes according to the distance between the eddy current sensor and the measurement target object, the distance to the measurement target object is detected with the detection coil from a change in the magnetic field generated by the eddy current induced in the measurement target object.

CITATION LIST

Patent Literature

Patent Literature 1: National Publication of International Patent Application No. 2009-500829
Patent Literature 2: Japanese Patent Laid-Open No. 2013-36881
Patent Literature 3: Japanese Patent Laid-Open No. 2005-121616

The conventional techniques, however, lack consideration of correcting, with a simple arrangement, with high accuracy, the temperature drift of the sensor for measuring the film thickness of the polishing target object.

That is, in the first conventional technique, the temperature sensor is provided for the purpose of correcting the temperature drift of the eddy current sensor, and a need therefore arises for a complicated arrangement.

In the second conventional technique, an output signal from the eddy current sensor when the polishing target object is not present above the eddy current sensor is obtained each time the polishing table rotates, and a correction value for the temperature drift is obtained on the basis of the average of a plurality of output signals obtained. The second conventional technique therefore entails difficulty in correcting the temperature drift of the sensor with high accuracy in real time while the polishing target object is being polished and, hence, for example, difficulty in detecting an end point of polishing of the polishing target object with high accuracy.

An object according to one aspect of the present invention is to correct, with a simple arrangement, with high accuracy, temperature drift of a sensor for measuring the film thickness of a polishing target object.

Furthermore, the conventional techniques lack consideration of improving the measuring accuracy of the eddy current sensor.

That is, the eddy current sensor gives a response as a capacitive sensor in addition to a response at the time of functioning as the eddy current sensor as described above. For example, a case where the film thickness of the polishing target object is measured while the polishing target object is being polished with the polishing pad is considered. In this case, when polishing of the polishing target object is executed, the film thickness of the polishing target object is reduced by polishing and the polishing pad is also reduced in thickness. With reduction in thickness of the polishing pad, the distance between the eddy current sensor and the polishing target object is reduced and the electrostatic capacity between the sensor coil of the eddy current sensor and the polishing target object is thereby changed. This change in electrostatic capacity is reflected in the output from the eddy current sensor. Therefore, the accuracy of measurement of the film thickness of the polishing target object is possibly degraded.

Therefore, an object according to one aspect of the present invention is to improve the measuring accuracy of an eddy current sensor.

SUMMARY OF INVENTION

To achieve the above-described object, according to one aspect of the present invention, there is provided a method of correcting a film thickness measurement value in which a signal output from a sensor for measuring a thickness of a polishing target object is corrected while a process of polishing the polishing target object is being performed, the polishing process including a first state where the sensor and the polishing target object do not face each other and a second state where the sensor and the polishing target object face each other, the method including: obtaining a first measurement signal output from the sensor in the first state; computing a correction value on the basis of the obtained first measurement signal and a reference signal set in advance with respect to the first measurement signal; obtaining a second measurement signal output from the sensor in the second state; and correcting the obtained second measurement signal on the basis of the computed correction value while the polishing process is being performed.

According to the aspect of the method of correcting a film thickness measurement value, the reference signal may be a signal output from the sensor in a state where the sensor and the polishing target object do not face each other when the polishing process is not being performed.

According to the aspect of the method of correcting a film thickness measurement value, the polishing process may include polishing the polishing target object by pressing the polishing target object on a polishing pad for polishing the polishing target object while rotating a polishing table to which the polishing pad is attached, the sensor may be set in the polishing table, the first state and the second state may appear alternately with the rotation of the polishing table, and correcting the second signal may be performed by correcting the second measurement signal obtained in the second state on the basis of a correction value computed on the basis of the first measurement signal obtained in the first state immediately before the second state and the reference signal.

According to the aspect of the method of correcting a film thickness measurement value, the reference signal may be a signal output from the sensor in a state where the sensor and the polishing target object do not face each other when calibration of the sensor is being performed.

According to the aspect of the method of correcting a film thickness measurement value, the reference signal may be a signal output from the sensor in a state where the sensor and the polishing target object do not face each other at an ambient temperature observed when the polishing process is not being performed.

According to the aspect of the method of correcting a film thickness measurement value, the sensor may be an eddy current sensor.

Furthermore, according to one aspect of the present invention, there is provided a film thickness corrector configured to correct a signal output from a sensor for measuring a film thickness of a polishing target object while a process of polishing the polishing target object is being performed, the polishing process including a first state where the sensor and the polishing target object do not face each other and a second state where the sensor and the polishing target object face each other, the film thickness corrector including: an acquisition section configured to obtain a first measurement signal output from the sensor in the first state and a second measurement signal output from the sensor in the second state; a computation section configured to compute a correction value on the basis of the first measurement signal obtained by the acquisition section and a reference signal set in advance with respect to the first measurement signal; and a correction section configured to correct the second measurement signal obtained by the acquisition section on the basis of the correction value computed by the computation section while the polishing process is being performed.

To achieve the above-described object, according to one aspect of the present invention, there is provided an eddy current sensor configured to measure a distance to a measurement target object or the film thickness of the measurement target object, the eddy current sensor including: a sensor coil configured to generate an eddy current in the measurement target object, and detect an induced magnetic field derived from generation of the eddy current; and an electrically conductive member disposed on the measurement target object side of the sensor coil.

According to the aspect of the eddy current sensor, the electrically conductive member may have an opposed portion opposed to the sensor coil.

According to the aspect of the eddy current sensor, the electrically conductive member may further have a peripheral portion connected to the opposed portion and covering at least part of the periphery of the sensor coil.

According to the aspect of the eddy current sensor, the electrically conductive member may be formed into a shape of a cap fitted around the sensor coil.

According to the aspect of the eddy current sensor, the electrically conductive member may be formed by containing polypropylene and carbon kneaded in polypropylene, a silicone resin, a synthetic resin with a vapor-deposited metal, glass with a vapor-deposited metal, rubber and carbon kneaded in the rubber, or a monocrystalline silicon substrate.

According to the aspect of the eddy current sensor, the electrically conductive member may be formed by containing a material having an electrical resistivity of 1 Ω·cm to 100 Ω·cm.

According to the aspect of the eddy current sensor, the eddy current sensor may further include a magnetic shield sheet disposed between the sensor coil and the electrically conductive member and having an opening facing the sensor coil.

According to the aspect of the eddy current sensor, the eddy current sensor may be an eddy current sensor for a polishing device, the eddy current sensor being provided in a hole formed in a polishing table to which a polishing pad for polishing a polishing target object is attached, the eddy current sensor being adapted to measure the distance to the polishing target object or the film thickness of the polishing target object. The sensor coil may generate an eddy current in the polishing target object and detect an induced magnetic field derived from the generation of the eddy current, and the electrically conductive member may be disposed on the polishing target object side of the sensor coil.

According to the aspect of the eddy current sensor, the electrically conductive member may be disposed between the sensor coil and the polishing pad.

According to the aspect of the eddy current sensor, the electrically conductive member may have an opposed portion opposed to the sensor coil and a peripheral portion connected to the opposed portion and facing an inner wall surface of the hole formed in the polishing table.

According to one aspect of the present invention as described above, temperature drift of the sensor for measuring the film thickness of a polishing target object can be accurately corrected with a simple arrangement.

According to one aspect of the present invention as described above, the measuring accuracy of the eddy current sensor can be improved.

DESCRIPTION OF EMBODIMENTS

A method of correcting a film thickness measurement value and a film thickness corrector according to an embodiment of the present invention will be described with reference to the drawings.

<Polishing Device>

Figure 1:
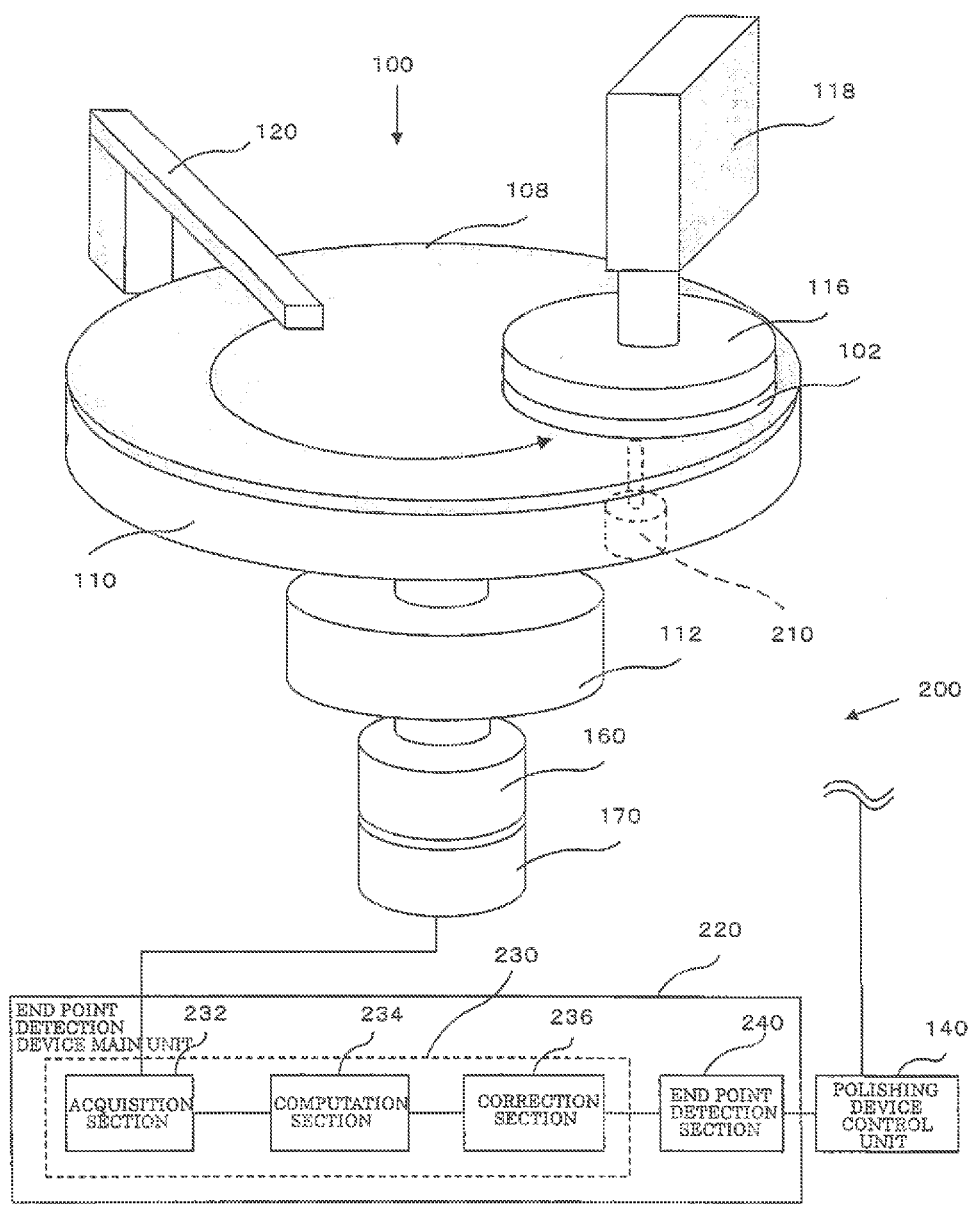
FIG. 1 is a schematic diagram showing the entire configuration of a polishing device and a film thickness corrector.

FIG. 1 is a schematic diagram showing the entire configuration of a polishing device and a film thickness corrector.

As shown in FIG. 1, a polishing device 100 is provided with a polishing table 110 capable of mounting on its upper surface a polishing pad 108 for polishing a polishing target object (e.g., a substrate such as a semiconductor wafer or any of various films formed on a surface of a substrate) 102, a first electric motor 112 for rotatively driving the polishing table 110, a top ring 116 capable of holding the polishing target object 102, and a second electric motor 118 for rotatively driving the top ring 116.

The polishing device 100 is also provided with slurry line 120 for supplying an abrasive solution containing an abrasive material onto an upper surface of the polishing pad 108. The polishing device 100 is further provided with a polishing device control unit 140 which outputs various control signals relating to the polishing device 100.

When polishing the polishing target object 102, the polishing device 100 supplies abrasive slurry containing abrasive grains from the slurry line 120 onto the upper surface of the polishing pad 108, and rotatingly drives the polishing table 110 with the first electric motor 112. The polishing device 100 then presses on the polishing pad 108 the polishing target object 102 held by the top ring 116 while rotating the top ring 116 on a rotating shaft eccentric to the rotating shaft of the polishing table 110. The polishing target object 102 is thereby polished with the polishing pad 108 on which the abrasive slurry is held so that the polishing target object 102 is made flat.

A polishing end point detection device 200 will subsequently be described. As shown in FIG. 1, polishing end point detection device 200 is provided with an eddy current sensor 210 and an end point detection device main unit 220 connected to the eddy current sensor 210 through rotary joint connectors 160 and 170.

<Eddy Current Sensor>

The eddy current sensor 210 will first be described. In the polishing table 110 and the polishing pad 108, a hole is formed in which the eddy current sensor 210 can be inserted from the back side of the polishing table 110. The eddy current sensor 210 is inserted in the hole formed in the polishing table 110 and the polishing pad 108.

Figure 2:
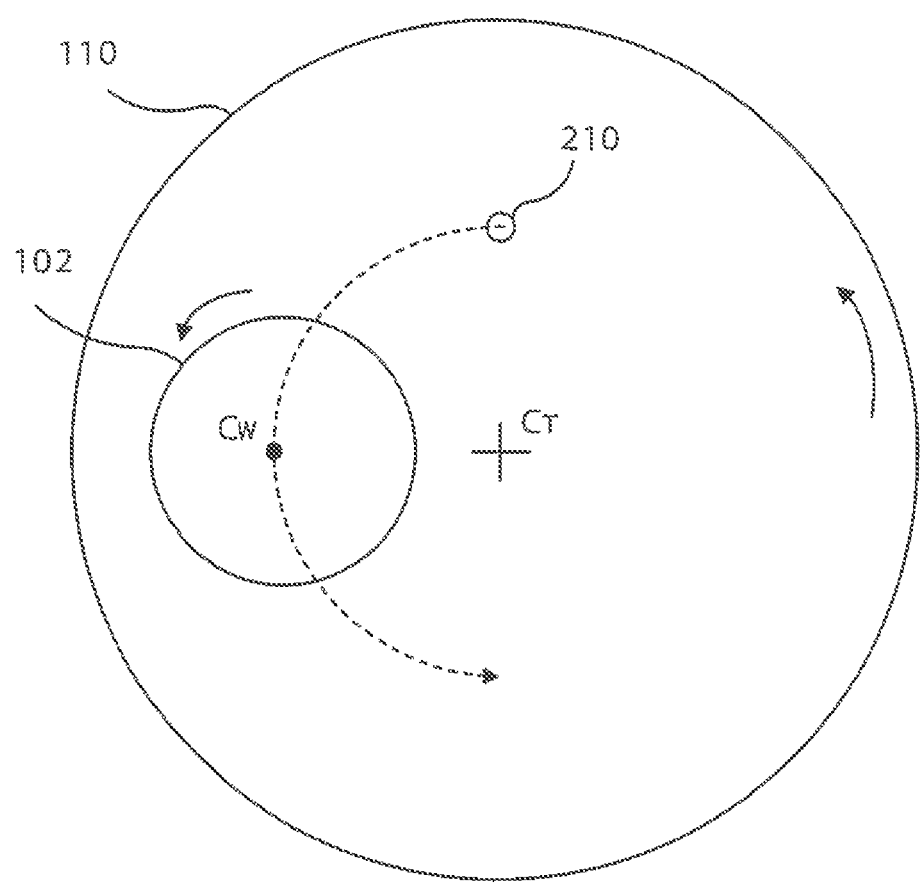
FIG. 2 is a plan view showing the relationships among a polishing table, an eddy current sensor and a polishing target object.

FIG. 2 is a plan view showing the relationships among the polishing table 110, the eddy current sensor 210 and the polishing target object 102. As shown in FIG. 2, the eddy current sensor 210 is set at a position passing through a center Cw of the polishing target object 102 held by the top ring 116 while the polishing target object 102 is being polished. Reference character $C_T$ denotes the center of rotation of the polishing table 110. For example, the eddy current sensor 210 is adopted to enable the thickness of the polishing target object 102 to be continuously detected on a passage locus (scanning line) while the eddy current sensor 210 is passing below the polishing target object 102.

Figure 3A:
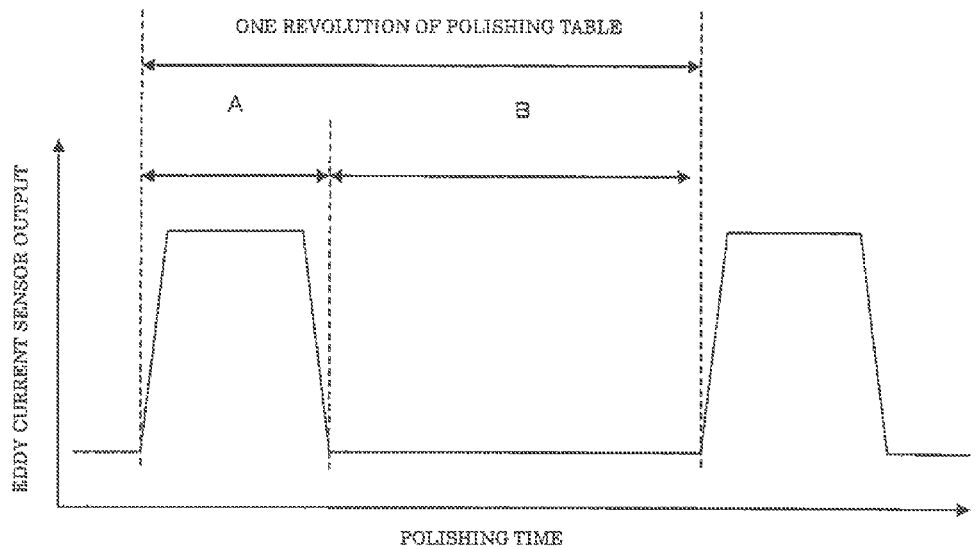
FIG. 3A shows an output from the eddy current sensor 210.
Figure 3B:
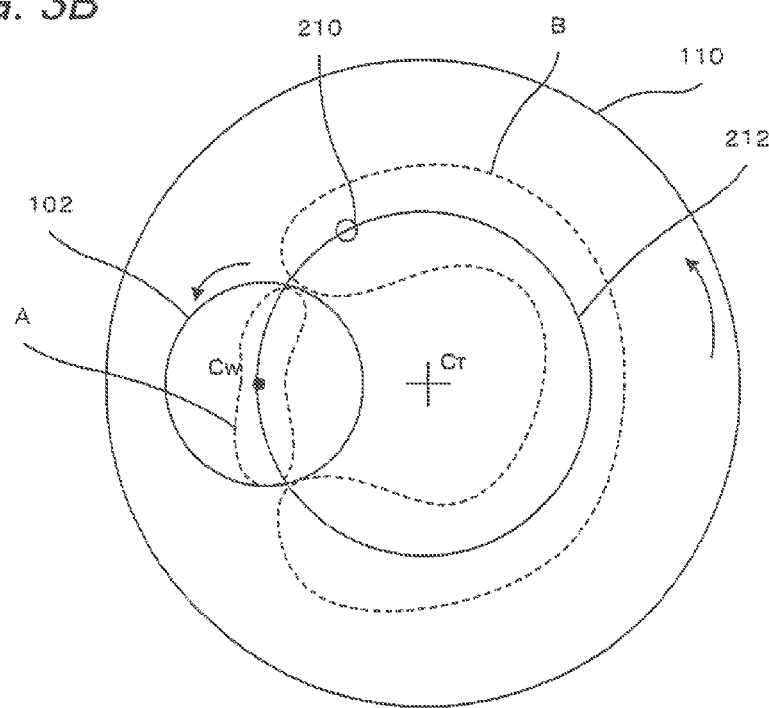
FIG. 3B shows a locus of the eddy current sensor 210 when the polishing target object 102 is scanned with the eddy current sensor 210.

FIGS. 3A and 3B are diagrams relating changes in an output from the eddy current sensor 210. FIG. 3A shows the output from the eddy current sensor 210. FIG. 3B shows a locus of the eddy current sensor 210 when the polishing target object 102 is scanned with the eddy current sensor 210. In FIG. 3A, the abscissa represents the polishing time and the ordinate represents the magnitude of the eddy current sensor output.

As shown in FIG. 3B, the polishing target object 102 is rotated on an axis corresponding to the center Cw at the position shown in FIG. 3B. On the other hand, with the rotation of the polishing table 110, the eddy current sensor 210 rotates along a locus 212 on an axis corresponding to the center $C_T$. As a result, the polishing process of polishing the polishing target object 102 includes a first state (out-of-polishing-target-object region B) in which the eddy current sensor 210 is not passing below the polishing target object 102 and the eddy current sensor 210 and the polishing target object 102 do not face each other. The polishing process also includes a second state (on-polishing-target-object region A) in which with passage of the eddy current sensor 210 below the polishing target object 102, the eddy current sensor 210 and the polishing target object 102 face each other. The first state and the second state appear alternately with the rotation of the polishing table 110. While an example of an arrangement in which the eddy current sensor 210 is set in the polishing table 110 and is rotated has been described, the present embodiment is not limited to this arrangement. The present embodiment can be applied to any arrangement as long as the polishing process includes the first state and the second state. While an example of use of the eddy current sensor 210 has been described, the present embodiment is not limited to this. Any other sensor capable of measuring the film thickness of the polishing target object 102 can be applied to the present embodiment.

As shown in FIG. 3A, a signal in generally rectangular pulse form is output from the eddy current sensor 210 in response to the polishing target object 102 when the eddy current sensor 210 is in the on-polishing-target-object region A. When the eddy current sensor 210 is in the out-of-polishing-target-object region B, a constant low-level signal is output from the eddy current sensor 210 since the polishing target object in which an eddy current is generated is not present.

Figure 4A:
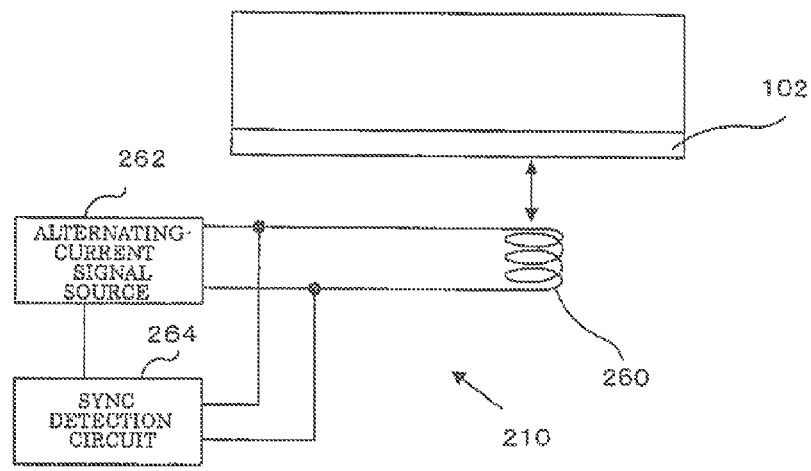
FIG. 4A is a block diagram showing the configuration of the eddy current sensor 210.
Figure 4B:
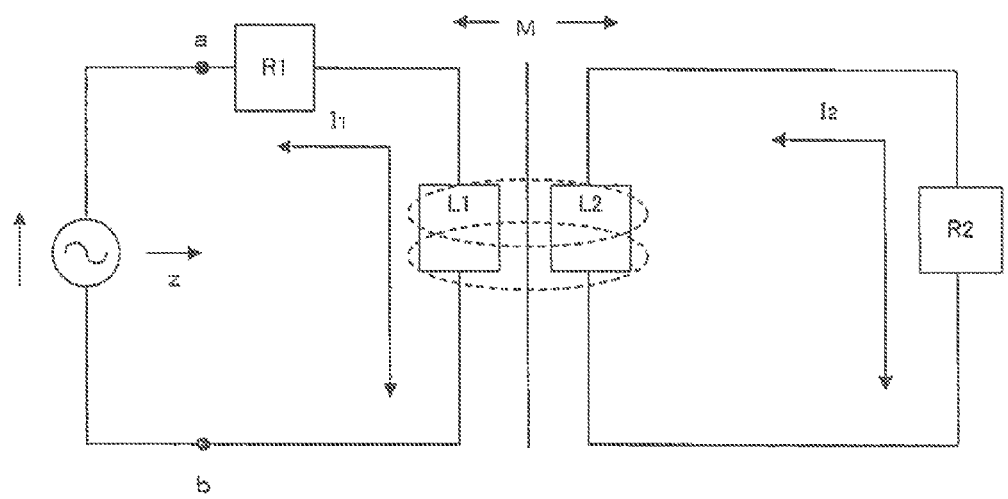
FIG. 4B is an equivalent circuit diagram of the eddy current sensor 210.

FIGS. 4A and 4B are diagrams showing a configuration of the eddy current sensor 210. FIG. 4A is a block diagram showing the configuration of the eddy current sensor 210. FIG. 4B is an equivalent circuit diagram of the eddy current sensor 210.

As shown in FIG. 4A, the eddy current sensor 210 is provided with a sensor coil 260 disposed in the vicinity of the polishing target object 102, e.g., a metal film to be detected. An alternating-current signal source 262 is connected to the sensor coil 260. The polishing target object 102 to be detected is, for example, a thin film of Cu, Al, Au or W formed on the semiconductor wafer. The sensor coil 260 is disposed in the vicinity of the polishing target object 102 to be detected, for example, at a distance of about 0.5 to 5.0 mm therefrom.

The eddy current sensor 210 may be of a frequency type such that a conductive film is detected on the basis of a change in oscillation frequency of the alternating-current signal source 262 due to occurrence of an eddy current in the polishing target object 102. The eddy current sensor 210 may alternatively be of an impedance type such that a conductive film is detected on the basis of a change in impedance seen from the alternating-current signal source 262 due to occurrence of an eddy current in the polishing target object 102. That is, in the case of the frequency type, impedance Z in the equivalent circuit shown in FIG. 3B is changed when eddy current $I_2$ is changed, resulting in a change in oscillation frequency of the alternating-current signal source (variable frequency oscillator) 262. The eddy current sensor 210 can detect the change in the conductive film by detecting the change in oscillation frequency with a detection circuit 264. In the case of the impedance type, impedance Z in the equivalent circuit shown in FIG. 3B is changed when eddy current $I_2$ is changed, resulting in a change in impedance Z seen from the alternating-current signal source (fixed frequency oscillator) 262. The eddy current sensor 210 can detect the change in the conductive film by detecting the change in impedance Z with the detection circuit 264.

From the impedance-type eddy current sensor, signal outputs X and Y, a phase and resultant impedance Z are taken out. Information on the measurement on the conductive film is obtained from frequency F or impedances X and Y for example. The eddy current sensor 210 can be incorporated in the polishing table 110 at a position in the vicinity of the surface, as shown in FIG. 1, and is capable of detecting the change in the conductive film from the eddy current flowing in the polishing target object 102 when located so as to face the polishing target object 102 through the polishing pad.

The impedance-type eddy current sensor will be concretely described below. The alternating-current signal source 262 is an oscillator of a fixed frequency of about 1 to 50 MHz. A crystal oscillator for example is used as the impedance-type eddy current sensor. Current $I_1$ is caused to flow through the sensor coil 260 by an alternating-current voltage supplied from the alternating-current signal source 262. With the current flowing through the sensor coil 260 disposed in the vicinity of the polishing target object 102, a magnetic flux generated from the sensor coil 260 intersects the polishing target object 102. As a result, mutual conductance M is formed between the sensor coil 260 and the polishing target object 102 and eddy current $I_2$ flows through the polishing target object 102. R1 denotes a resistance on the primary side including the sensor coil 260. Similarly, $L_1$ denotes self-inductance on the primary side including the sensor coil 260. R2 denotes a resistor on the polishing target object 102 side, which corresponds to eddy-current loss. $L_2$ denotes self-inductance of the polishing target object 102. Impedance Z on the sensor coil 260 side seen from terminals a and b of the alternating-current signal source 262 changes under the influence of lines of magnetic force generated by eddy current $I_2$.

Figure 5:
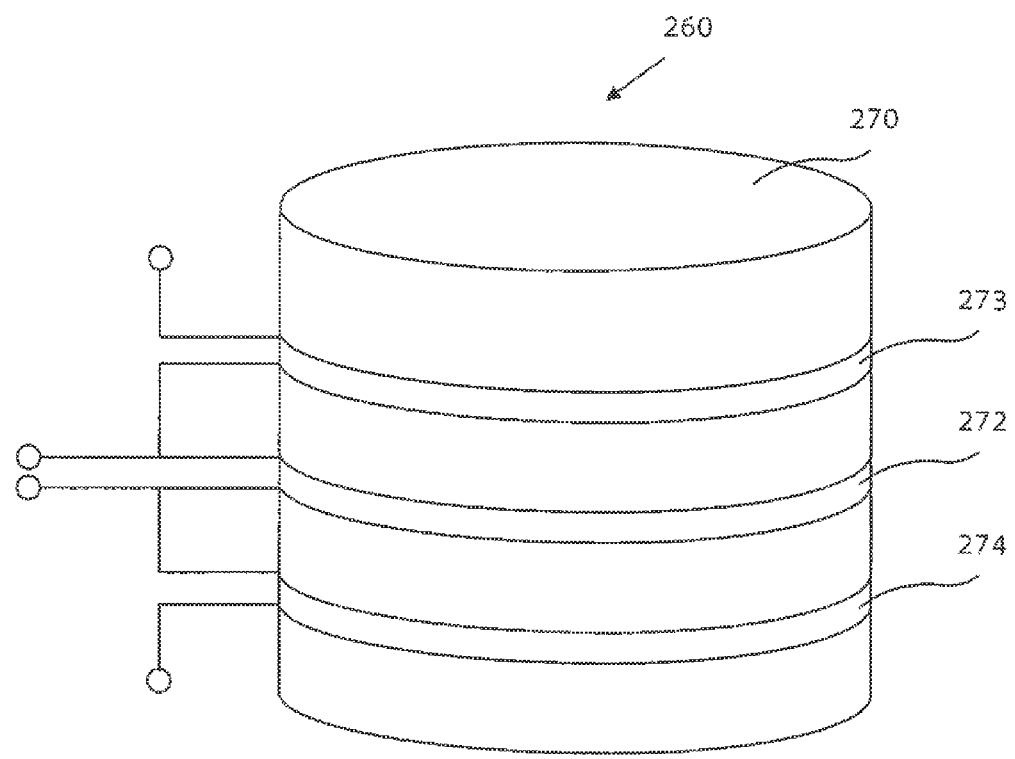
FIG. 5 is a schematic diagram showing an example of a configuration of the sensor coil used in the eddy current sensor according to the present invention.

FIG. 5 is a schematic diagram showing an example of a configuration of the sensor coil used in the eddy current sensor according to the present invention. As shown in FIG. 5, the sensor coil 260 of the eddy current sensor includes three coils 272, 273, and 274 wound around a bobbin 270. The coil 272 is an excitation coil connected to the alternating-current signal source 262. The excitation coil 272 is excited by the alternating current supplied from the alternating-current signal source 262 to form an eddy current in polishing target object 102 disposed in the vicinity thereof. The detection coil 273 is disposed on the polishing target object 102 side of the bobbin 270 to detect a magnetic field generated due to the eddy current formed in the polishing target object 102. The balance coil 274 is disposed opposite from the detection coil 273, with the excitation coil 272 interposed therebetween.

The coils 272, 273, and 274 are formed of coils whose numbers of turns are equal to each other. The detection coil 273 and the balance coil 274 are connected in phase opposition to each other. When the polishing target object 102 exits in the vicinity of the detection coil 273, a magnetic flux caused by the eddy current formed in the polishing target object 102 intersects the detection coil 273 and the balance coil 274. At this time, since the detection coil 273 is disposed at a position closer to the conductive film, induced voltages generated in the two coils 273 and 274 are unbalanced, thereby enabling detection of the intersecting magnetic flux formed by the eddy current flowing in the conductive film.

Figure 6:
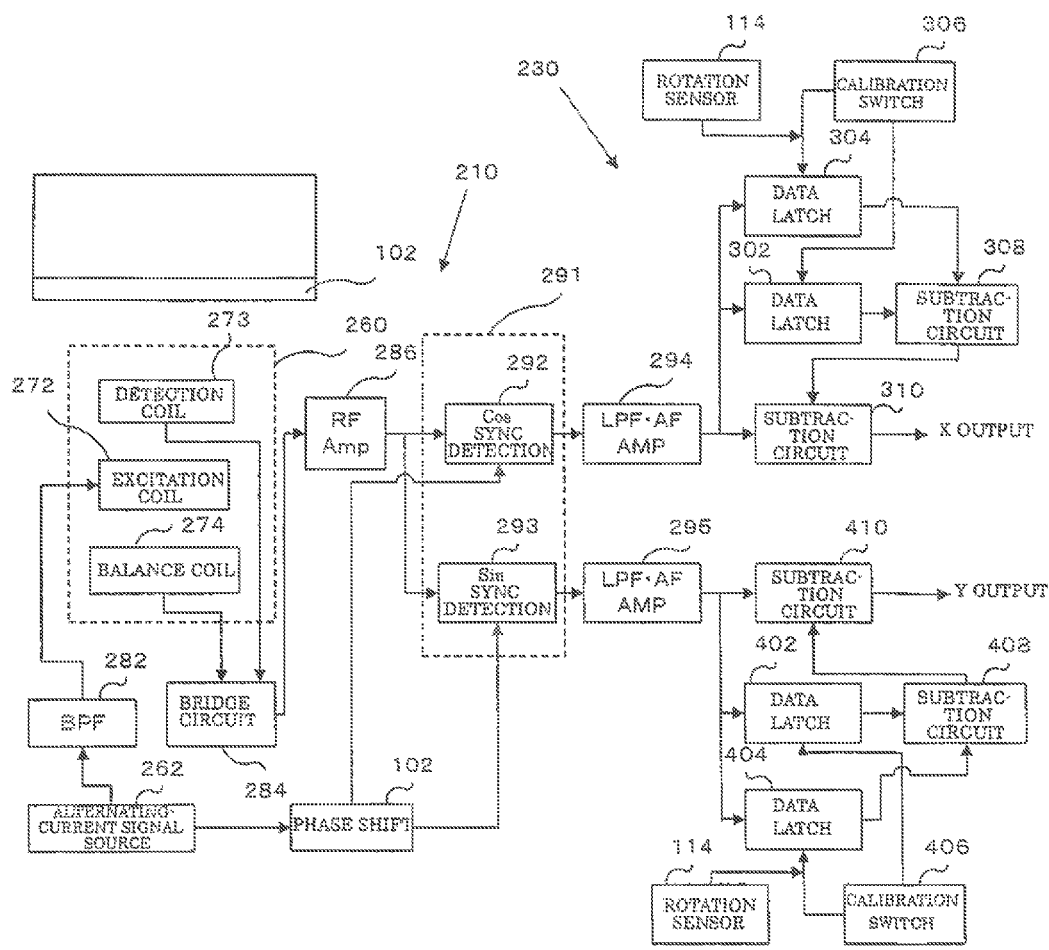
FIG. 6 is a schematic diagram showing details of the configuration of the eddy current sensor.

FIG. 6 is a schematic diagram showing details of the configuration of the eddy current sensor. The alternating-current signal source 262 has an oscillator of a fixed frequency such as a crystal oscillator and supplies an alternating current having a fixed frequency of, for example, 1 to 50 MHz to the sensor coil 260. The alternating current formed in the alternating-current signal source 262 is supplied to the sensor coil 260 (excitation coil 272) through a band-pass filter (BPF) 282. On the other hand, signals output from the terminals of the sensor coil 260 (detection coil 273 and balance coil 274) are sent to a sync detection section 291 including a cos sync detection circuit 292 and a sin sync detection circuit 293 via a bridge circuit 284 and a radiofrequency amplifier (RF Amp) 286. The resistance component and the induction reactance component of the impedance are taken out in the sync detection section 291.

From the resistance component and the induction reactance component output from the sync detection section 291, unnecessary high-frequency components (e.g., high-frequency components having frequencies equal to or higher than 5 kHz) are removed by low-pass filters (LPF·AF AMPs) 294 and 295, thereby outputting signals X and Y as the resistance component and the induction reactance component, respectively, of the impedance. The signals X and Y output from the LPF·AF AMPs 294 and 295 undergo correction by a film thickness corrector 230 described below and are thereafter output to an end point detection section 240.

The end point detection section 240 processes the signals X and Y output from the film thickness corrector 230, for example, by rotation processing and parallel movement processing to compute a distance Z as a monitoring signal, and monitors changes in film thickness on the basis of changes in distance Z.

Figure 7:
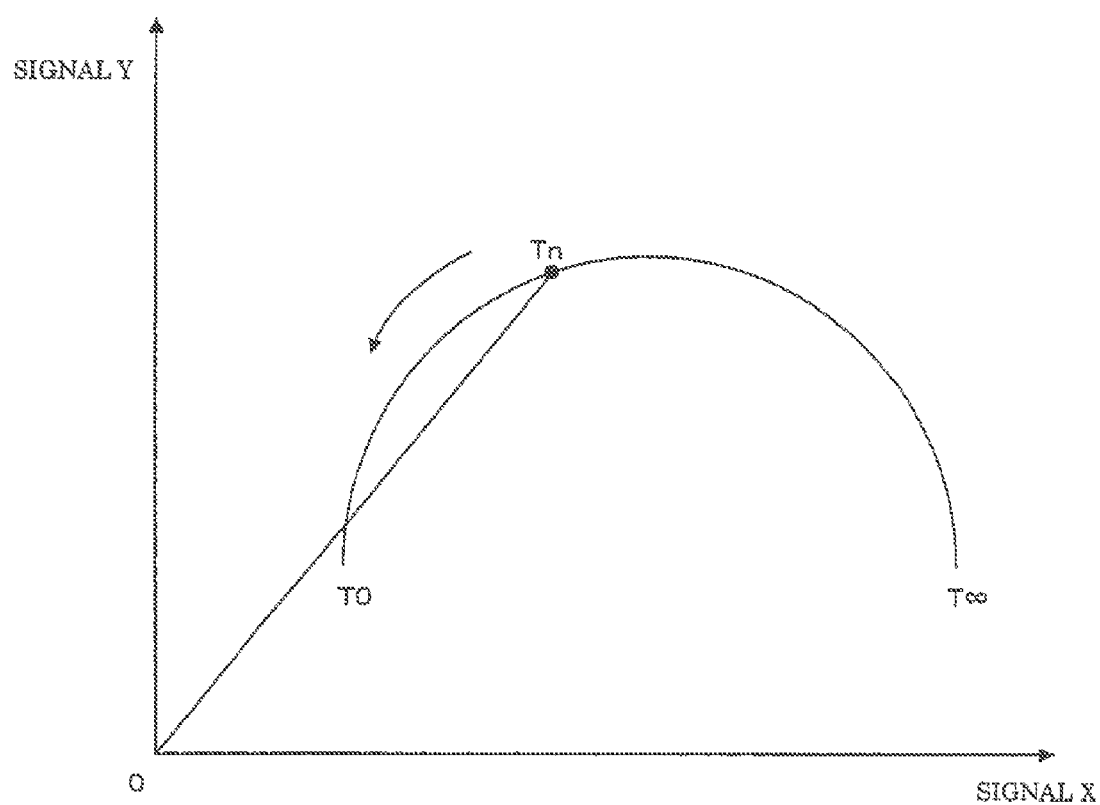
FIG. 7 shows an outline of processing performed by an end point detection section.

FIG. 7 shows an outline of processing performed by the end point detection section 240. In FIG. 7, the abscissa represents the intensity of a signal X while the ordinate represents the intensity of a signal Y. Point T∞ indicates a state where the film thickness of the polishing target object 102 is ∞, and point T0 indicates a state where the film thickness of the polishing target object 102 is 0. With reduction in film thickness of the polishing target object 102, point Tn positioned from the values of the signals X and Y moves toward point T0 while generating a circular-arc locus. Distance Z ($=(X^2+Y^2)^{1/2}$) from the origin O of the XY coordinate system to point Tn is reduced with reduction in film thickness except in the vicinity of point T∞.

The end point detection section 240 computes the distance Z that changes according to the film thickness of the polishing target object 102. The end point detection section 240 can detect the film thickness of the polishing target object 102 during polishing by monitoring the distance Z if it grasps the relationship between the distance Z and the film thickness of the polishing target object 102 empirically or by testing.

The end point detection section 240 is connected to the polishing device control unit 140 that performs various sorts of control relating to the polishing device 100. When the end point detection section 240 detects an end point of polishing of the polishing target object 102 on the basis of the computed distance Z, it outputs to the polishing device control unit 140 a signal indicating the detected end point. The polishing device control unit 140 receives the signal indicating the polishing end point from the end point detection section 240 and stops polishing with the polishing device 100.

<Correction of Output from Eddy Current Sensor 210>

In the present embodiment, signals (signal X and signal Y) output from the eddy current sensor 210 are corrected. That is, heat is generated by friction between the polishing target object 102 and the polishing pad 108 during polishing of the polishing target object 102. There is a possibility of the output from the eddy current sensor 210 drifting due to a rise in ambient temperature around the eddy current sensor 210 caused by this heat.

Figure 8A:
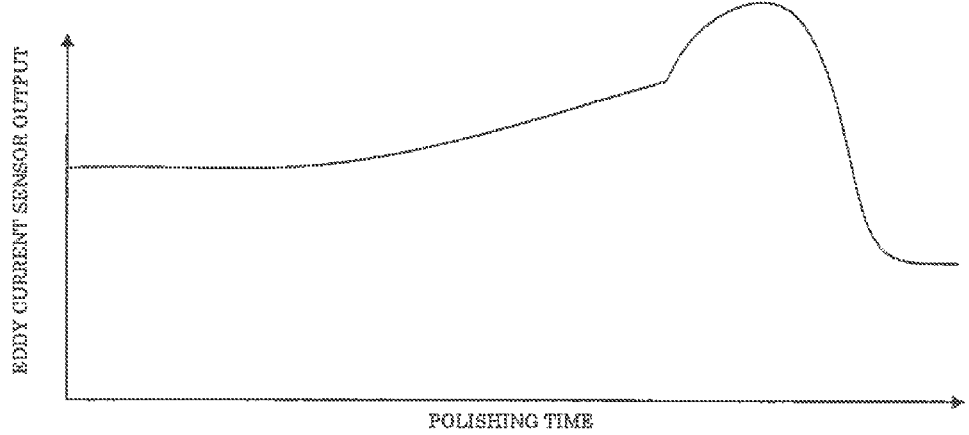
FIG. 8A shows changes in the output from the eddy current sensor.
Figure 8B:
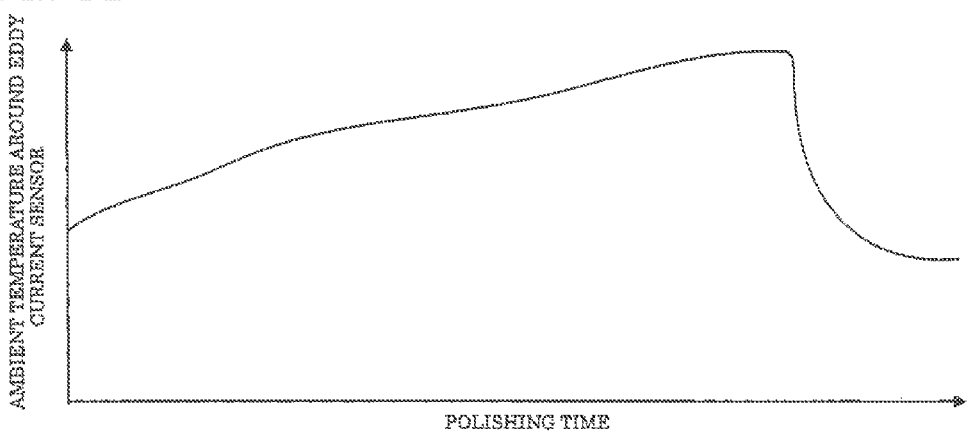
FIG. 8B shows changes in the ambient temperature around the eddy current sensor.

FIGS. 8A and 8B are diagrams schematically showing an example of drifting of the output from the eddy current sensor under the influence of the ambient temperature. FIG. 8A shows changes in the output from the eddy current sensor. FIG. 8B shows changes in the ambient temperature around the eddy current sensor. In FIG. 8A, the abscissa represents the polishing time and the ordinate represents the eddy current sensor output. In FIG. 8B, the abscissa represents the polishing time and the ordinate represents the ambient temperature around the eddy current sensor.

FIGS. 8A and 8B respectively show the ambient temperature around the eddy current sensor 210 and the output from the eddy current sensor 210 when a substrate on which no metal film is formed and in which no eddy current is generated, that is, no action sensible by the eddy current sensor 210 occurs, is polished.

As shown in FIG. 8B, the ambient temperature around the eddy current sensor 210 rises with the progress in polishing under the influence of friction heat as a result of polishing of the substrate. Since the substrate in which no action sensible by the eddy current sensor 210 occurs is polished, the output from the eddy current sensor 210 is primarily expected to be constant. The output from the eddy current sensor 210, however, changes (drifts) depending on the ambient temperature around the eddy current sensor 210, as shown in FIG. 8A.

Then, in the present embodiment, signals output from the eddy current sensor 210 are corrected in a mode described below. As shown in FIG. 1, the end point detection device main unit 220 is provided with the film thickness corrector 230 and the end point detection section 240.

The film thickness corrector 230 corrects the signals output from the eddy current sensor 210 during execution of the process of polishing the polishing target object 102 (in situ). The film thickness corrector 230 has an acquisition section 232, a computation section 234 and a correction section 236.

The acquisition section 232 obtains, while the polishing process is being performed, a first measurement signal output from the eddy current sensor 210 in the first state (out-of-polishing-target-object region B) in which the eddy current sensor 210 and the polishing target object 102 do not face each other. Also, the acquisition section 232 obtains, while the polishing process is being performed, a second measurement signal output from the eddy current sensor 210 in the second state (on-polishing-target-object region A) in which the eddy current sensor 210 and the polishing target object 102 face each other.

The computation section 234 computes a correction value on the basis of the first measurement signal obtained by the acquisition section 232 and a reference signal set in advance with respect to the first measurement signal. Specific examples of this reference signal are as follows. A signal output from the eddy current sensor 210 in a state where the eddy current sensor 210 and the polishing target object 102 do not face each other when the polishing process is not being performed may be set as this reference signal. A signal output from the eddy current sensor 210 in a state where the eddy current sensor 210 and the polishing target object 102 do not face each other when calibration of the eddy current sensor 210 is performed may be set as this reference signal. Also, a signal output from the eddy current sensor 210 in a state where the eddy current sensor 210 and the polishing target object 102 do not face each other at an ambient temperature observed when the polishing process is not being performed may be set as this reference signal. That is, a signal to be set as a reference signal with respect to the first state (out-of-polishing-target-object region B) is obtained in advance in a state where no temperature drift occurs in the output from the eddy current sensor 210. Since any signal obtained when no temperature drift occurs in the eddy current sensor 210 can be set as a reference signal, a signal output from the eddy current sensor 210 in the first state (out-of-polishing-target-object region B), for example, before the ambient temperature rises immediately after the start of the polishing process may be set as a reference signal.

The computation section 234 can compute a correction value, for example, by subtracting a reference signal set in advance from the first measurement signal obtained by the acquisition section 232.

The correction section 236 corrects, on the basis of the correction values computed by the computation section 234, the second measurement signal obtained by the acquisition section 232 during execution of the polishing process.

The correction section 236 subtracts the correction value computed by the computation section 234 from the second measurement signal obtained by the acquisition section 232 during execution of the polishing process to correct the second measurement signal.

More specifically, the correction section 236 corrects the second measurement signal obtained in the second state on the basis of the correction value computed on the basis of the reference signal and the first measurement signal obtained in the first state that appear immediately before the second state.

That is, when the first measurement signal is obtained by the acquisition section 232 in the first state in a time phase (T1) during execution of the polishing process, the computation section 234 computes a correction value ($\Delta S1$) by subtracting a reference signal set in advance from the obtained first measurement signal. When the second measurement signal is obtained by the acquisition section 232 in the second state appearing immediately after the time phase (T), the correction section 236 corrects the second measurement signal by subtracting from the obtained second measurement signal the correction value ($\Delta S1$) computed by the computation section 234 in the first state in the time phase (T1).

Similarly, when the first measurement signal is obtained by the acquisition section 232 in the first state in a time phase (T2) during execution of the polishing process, the computation section 234 computes a correction value ($\Delta S2$) by subtracting the reference signal set in advance from the obtained first measurement signal. When the second measurement signal is obtained by the acquisition section 232 in the second state appearing immediately after the time phase (T), the correction section 236 corrects the second measurement signal by subtracting from the obtained second measurement signal the correction value ($\Delta S2$) computed by the computation section 234 in the first state in the time phase (T2).

The description has been made by assuming that the film thickness corrector 230 has the acquisition section 232, the computation section 234 and the correction section 236 provided as functional blocks is implemented in the form of computer software. The present invention, however, is not limited to this. The film thickness corrector 230 may be implemented in the form of hardware as shown in FIG. 6.

As shown in FIG. 6, the film thickness corrector 230 is provided with data latches 302 and 304, a calibration switch 306, a subtraction circuit 308 and a subtraction circuit 310.

The data latches 302 and 304 each hold the signal X output from the LPF·AF AMP 294 in the first state (out-of-polishing-target-object region B) where the eddy current sensor 210 and the polishing target object 102 do not face each other or a reference signal output from the calibration switch 306. The data latch 304 outputs the held signal X or reference signal to the subtraction circuit 308 according to a trigger signal from a rotation sensor 114 for detecting the completion of one revolution of the polishing table 110. The rotation sensor 114 may include a dog placed along the periphery of the polishing table 110 and a dog sensor capable of detecting the dog and provided on the polishing table 110. The dog sensor detects the dog each time the polishing table 110 makes one revolution. The rotation sensor 114 can thereby detect a particular rotational position of the polishing table 110.

The subtraction circuit 308 executes subtraction between the signal X and the reference signal output from the data latches 302 and 304. More specifically, since the eddy current sensor 210 tends to issue a higher output due to temperature drift, the subtraction circuit 308 computes a correction value by subtracting the reference signal from the signal X. The subtraction circuit may be replaced with an addition circuit according to the tendency of the temperature drift of the sensor used.

The subtraction circuit 310 executes subtraction between the signal X output from the LPF·AF AMP 294 in the second state (on-polishing-target-object region A) where the eddy current sensor 210 and the polishing target object 102 face each other and the correction value output from the subtraction circuit 308. More specifically, since the eddy current sensor 210 tends to issue a higher output due to temperature drift, the subtraction circuit 310 computes the corrected signal X by subtracting the correction value from the signal X in the second state (on-polishing-target-object region A). The subtraction circuit may be replaced with an addition circuit according to the tendency of the temperature drift of the sensor used.

Similarly, the film thickness corrector 230 is provided with data latches 402 and 404, a calibration switch 406, a subtraction circuit 408 and a subtraction circuit 410.

The data latches 402 and 404 each hold the signal Y output from the LPF·AF AMP 295 in the first state (out-of-polishing-target-object region B) where the eddy current sensor 210 and the polishing target object 102 do not face each other or a reference signal output from the calibration switch 406. The data latch 404 outputs the held signal Y or reference signal to the subtraction circuit 408 according to a trigger signal from a rotation sensor 114 for detecting the completion of one revolution of the polishing table 110.

The subtraction circuit 408 executes subtraction between the signal Y and the reference signal output from the data latches 402 and 404. More specifically, since the eddy current sensor 210 tends to issue a higher output due to temperature drift, the subtraction circuit 408 computes a correction value by subtracting the reference signal from the signal Y. The subtraction circuit may be replaced with an addition circuit according to the tendency of the temperature drift of the sensor used.

The subtraction circuit 410 executes subtraction between the signal Y output from the LPF·AF AMP 295 in the second state (on-polishing-target-object region A) where the eddy current sensor 210 and the polishing target object 102 face each other and the correction value output from the subtraction circuit 408. More specifically, since the eddy current sensor 210 tends to issue a higher output due to temperature drift, the subtraction circuit 410 computes the corrected signal Y by subtracting the correction value from the signal Y in the second state (on-polishing-target-object region A). The subtraction circuit may be replaced with an addition circuit according to the tendency of the temperature drift of the sensor used.

<Flowchart>

Figure 9:
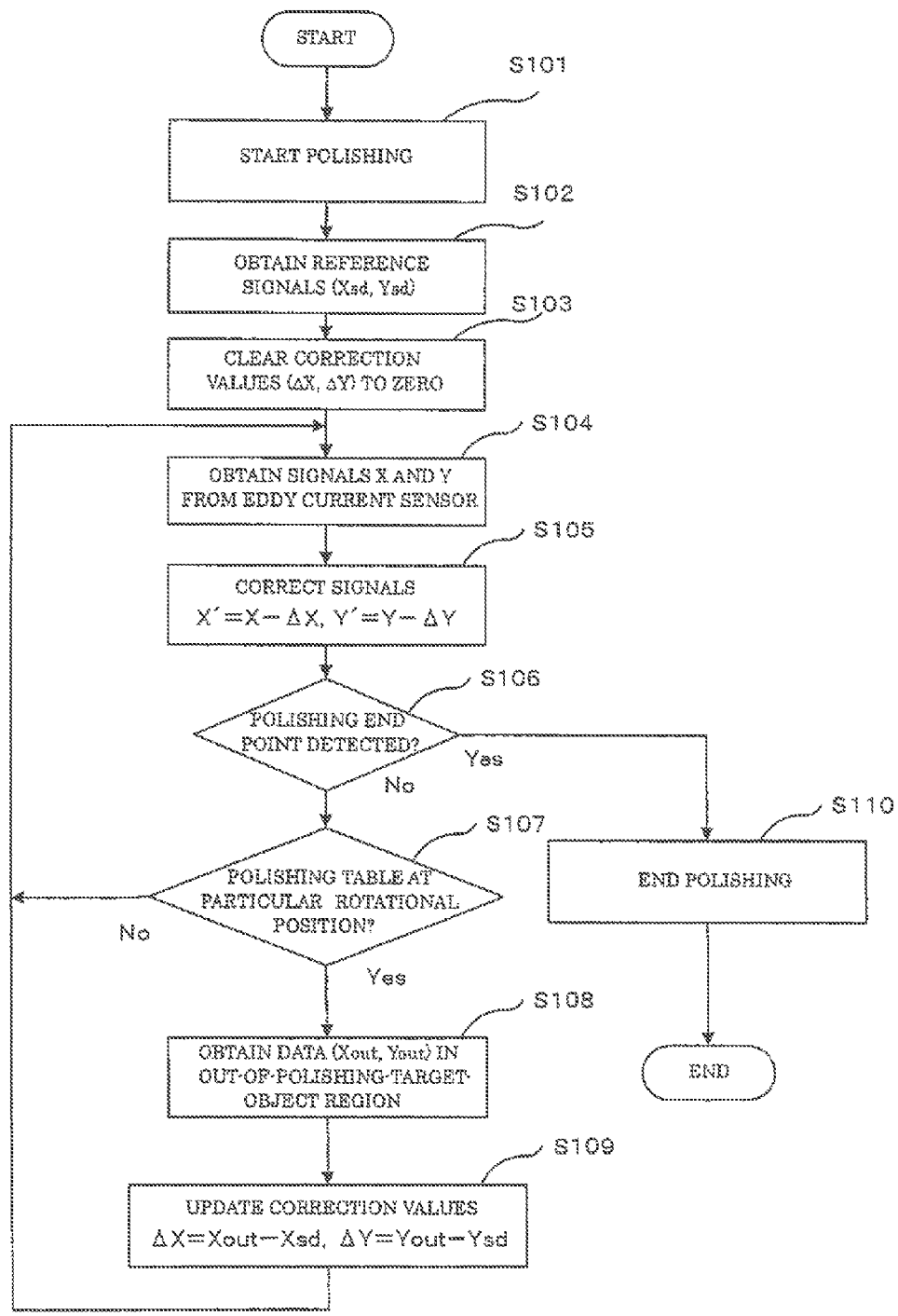
FIG. 9 is a flowchart showing processing according to the method of correcting a film thickness measurement value in the present embodiment.

The method of correcting a film thickness measurement value in the present embodiment will subsequently be described. FIG. 9 is a flowchart showing processing according to the method of correcting a film thickness measurement value in the present embodiment.

When the polishing step is started by the polishing device control unit 140 (step S101), the computation section 234 obtains reference signals (Xsd, Ysd) (step S102). The reference signals (Xsd, Ysd) are signals obtained in advance and recorded in a memory or the like, for example, in a state where no temperature drift occurs in the output from the eddy current sensor 210 (e.g., at the time of calibration of the eddy current sensor 210). Since any signals obtained when no temperature drift occurs in the eddy current sensor 210 can be set as reference signals, signals output from the eddy current sensor 210 in the first state (out-of-polishing-target-object region B), for example, before the ambient temperature rises immediately after the start of the polishing process may be set as reference signals.

Subsequently, the correction section 236 clears correction values ($\Delta X$, $\Delta Y$) to zero (step S103). This is for the purpose of resetting correction values ($\Delta X$, $\Delta Y$) set in the preceding polishing process.

Subsequently, the acquisition section 232 obtains the signals X and Y from the eddy current sensor 210 (step S104)

Subsequently, the correction section 236 corrects the signals X and Y (step S105). More specifically, if X' denotes the signal X after correction and Y' denotes the signal Y after correction, the correction section 236 obtains the corrected signals X' and Y' by X'=X−$\Delta X$ and Y'=Y−$\Delta Y$.

Subsequently, the end point detection section 240 determines whether or not a polishing end point has been reached on the basis of the corrected signals X' and Y' (step S106).

If the result of determination by the end point detection section 240 is that the polishing end point has not been reached (step S106, No), the rotation sensor 114 determines whether or not the polishing table 110 has rotated to a particular rotational position (step S107). More specifically, the rotational position of the polishing table 110 at which the eddy current sensor 210 is in the first state (out-of-polishing-target-object region B) can be set as a particular rotational position. In other words, the rotation sensor 114 determines whether or not the eddy current sensor 210 has entered the first state (out-of-polishing-target-object region B).

If it is determined that the polishing table 110 has rotated to the particular rotational position (step S107, Yes), the acquisition section 232 obtains first measurement signals (Xout, Yout) output from the eddy current sensor 210 in the first state (out-of-polishing-target-object region B) (step S108).

Subsequently, the computation section 234 updates the correction values (step S109). More specifically, if the correction values are ΔX and ΔY, the computation section 234 computes and updates the correction values ΔX and ΔY by ΔX=Xout−Xsd, ΔY=Yout−Ysd. While an example of computation of the correction values ΔX and ΔY based on the first measurement signals (Xout, Yout) at one point in the first state is shown in the present embodiment, the present invention is not limited to this computation. For example, the process may alternatively be such that the first measurement signals (Xout, Yout) in the first state are obtained at a plurality of points during a period before the first state changes to the second state after the start of the first state; an average value of the first measurement signals (Xout, Yout) at the plurality of points is obtained; and the reference signals are subtracted from the average value.

Thereafter, the process returns to step S104 to repeat the same process steps. Accordingly, when the eddy current sensor 210 enters the second state (on-polishing-target-object region A), the second measurement signals (signal X, signal Y) output from the eddy current sensor 210 are corrected on the basis of the correction values ΔX and ΔY updated in the first state immediately before this second state.

Further, when it is determined in step S107 that the polishing table 110 has not rotated to the particular rotational position (step S107, No), the process also returns to step S104 to repeat the same process steps.

As a result, the second measurement signals (signal X, signal Y) obtained in the second state at a plurality of points for the duration of the second state (on-polishing-target-object region A) are corrected on the basis of the correction values ΔX and ΔY.

If it is determined in step S106 by the end point detection section 240 that the polishing end point has been reached (step S106, Yes), the polishing device control unit 140 stops polishing (step S110).

Figure 10A:
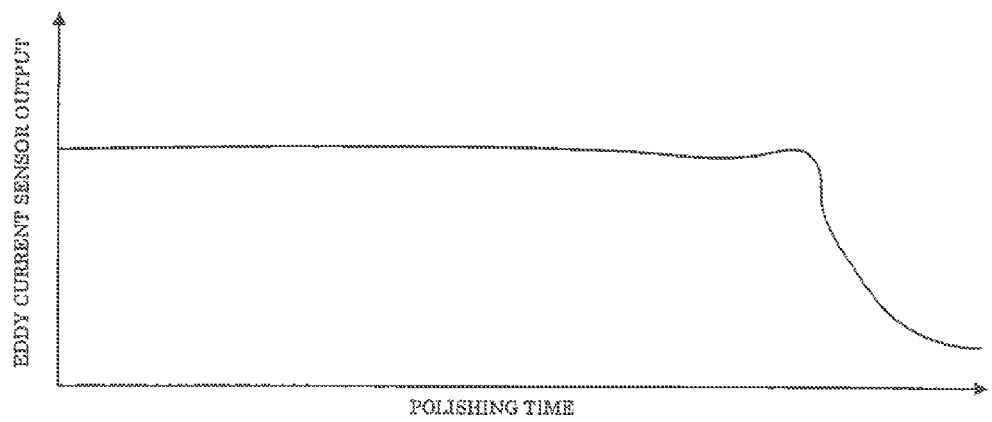
FIG. 10A shows changes in the output from the eddy current sensor.
Figure 10B:
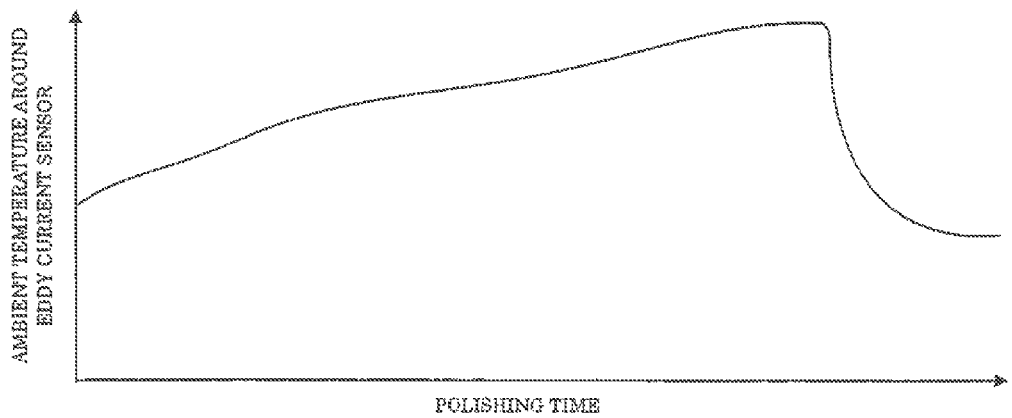
FIG. 10B shows changes in the ambient temperature around the eddy current sensor.

FIGS. 10A and 10B are diagram schematically showing the output from the eddy current sensor 210 in a case where correction according to the present embodiment is performed. FIG. 10A shows changes in the output from the eddy current sensor. FIG. 10B is a diagram showing changes in the ambient temperature around the eddy current sensor. In FIG. 10A, the abscissa represents the polishing time and the ordinate represents the eddy current sensor output. In FIG. 10B, the abscissa represents the polishing time and the ordinate represents the ambient temperature around the eddy current sensor.

FIGS. 10A and 10B respectively show the ambient temperature around the eddy current sensor 210 and the output from the eddy current sensor 210 when a substrate on which no metal film is formed and in which no eddy current is generated, i.e., no action sensible by the eddy current sensor 210 occurs, is polished, as do FIGS. 8A and 8B.

As shown in FIG. 10B, the ambient temperature around the eddy current sensor 210 rises with the progress in polishing under the influence of friction heat as a result of polishing of the substrate. In the present embodiment, since the output from the eddy current sensor 210 is corrected according to changes in ambient temperature, the output from the eddy current sensor 210 is constant, as shown in FIG. 10A.

Thus, in the present embodiment, the temperature drift of the sensor for measuring the film thickness of the polishing target object 102 can be accurately corrected with a simple arrangement. That is, in the present embodiment, the need for a temperature sensor for correcting the temperature drift of the sensor is eliminated and a simpler arrangement therefore suffices. In the present embodiment, the measurement signal output from the sensor is corrected on the basis of the correction value during execution of the polishing process (in situ). In the present embodiment, therefore, the temperature drift of the sensor can be accurately corrected in real time while the polishing target object 102 is being polished. As a result, in the present embodiment, an end point of polishing of the polishing target object 102 can be detected with high accuracy.

In particular, in the present embodiment, the second measurement signal obtained in the second state is corrected on the basis of the correction value computed on the basis of the first measurement signal and the reference signal obtained in the first state having appeared immediately before the second state. The temperature drift of the sensor can thereby be reflected with high accuracy, thus improving the reliability of the corrected second measurement signal.

An eddy current sensor according to one embodiment of the present invention will be described with reference to the drawings. An eddy current sensor 1210 described below can be used as the eddy current sensor 210 in the above-described embodiment.

<Polishing Device>

Figure 11:
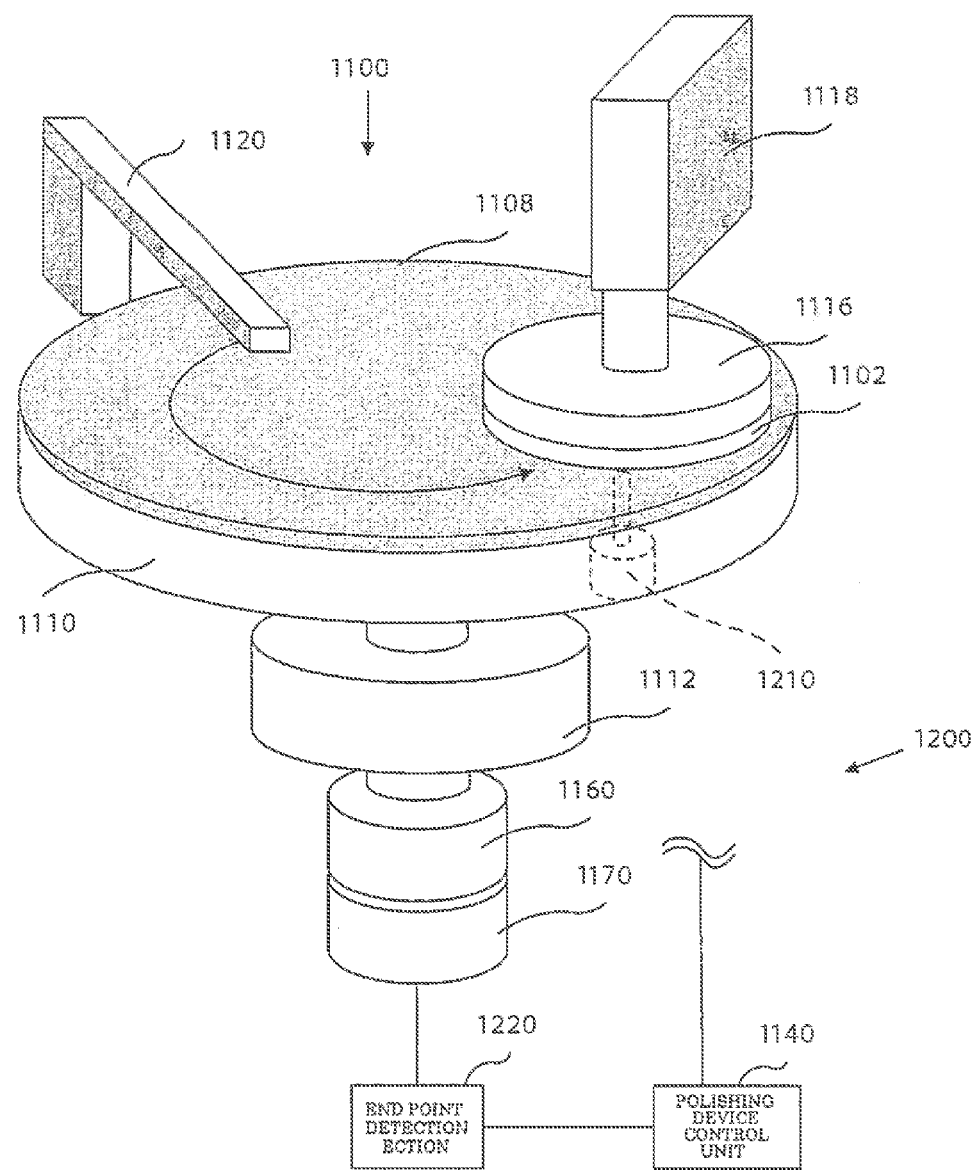
FIG. 11 is a schematic diagram showing the entire configuration of a polishing device and an end point detection device.

FIG. 11 is a schematic diagram showing the entire configuration of a polishing device and an end point detection device.

As shown in FIG. 11, a polishing device 1100 is provided with a polishing table 1110 capable of mounting on its upper surface a polishing pad 1108 for polishing a polishing target object (e.g., a substrate such as a semiconductor wafer or any of various films formed on a surface of a substrate) 1102, a first electric motor 1112 for rotatively driving the polishing table 1110, a top ring 1116 capable of holding the polishing target object 1102, and a second electric motor 1118 for rotatively driving the top ring 1116.

The polishing device 1100 is also provided with slurry line 1120 for supplying an abrasive solution containing an abrasive material onto an upper surface of the polishing pad 1108. The polishing device 1100 is further provided with a polishing device control unit 1140 which outputs various control signals relating to the polishing device 1100.

When polishing the polishing target object 1102, the polishing device 1100 supplies abrasive slurry containing abrasive grains from the slurry line 1120 onto the upper surface of the polishing pad 1108, and rotatingly drives the polishing table 1110 with the first electric motor 1112. The polishing device 1100 then presses on the polishing pad 1108 the polishing target object 1102 held by the top ring 1116 while rotating the top ring 1116 on a rotating shaft eccentric to the rotating shaft of the polishing table 1110. The polishing target object 1102 is thereby polished with the polishing pad 1108 on which the abrasive slurry is held so that the polishing target object 1102 is made flat.

A polishing end point detection device 1200 will subsequently be described. As shown in FIG. 11, polishing end point detection device 1200 is provided with an eddy current sensor 1210 and an end point detection device main unit 1220 connected to the eddy current sensor 1210 through rotary joint connectors 1160 and 1170.

<Eddy Current Sensor>

The eddy current sensor 1210 will first be described. In the polishing table 1110, a hole is formed in which the eddy current sensor 1210 can be inserted from the back side of the polishing table 1110. The eddy current sensor 1210 is inserted in the hole formed in the polishing table 1110. The polishing table 1110 is grounded.

Figure 12:
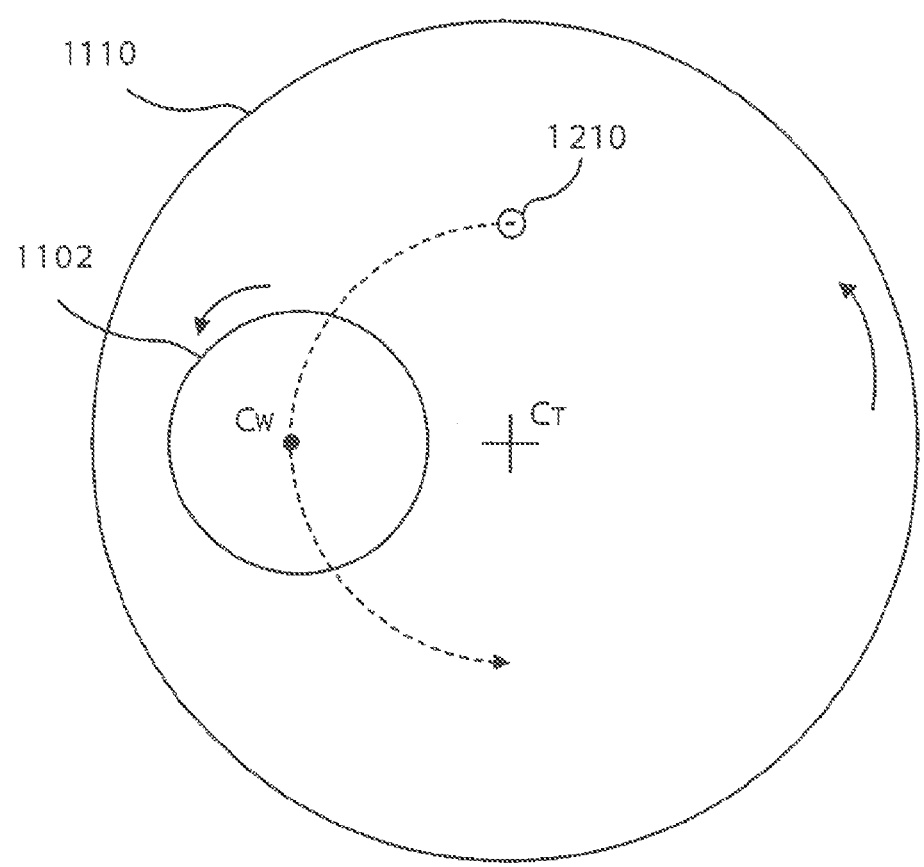
FIG. 12 is a plan view showing the relationships among a polishing table, an eddy current sensor and a polishing target object.

FIG. 12 is a plan view showing the relationships among the polishing table 1110, the eddy current sensor 1210 and the polishing target object 1102. As shown in FIG. 12, the eddy current sensor 1210 is set at a position passing through a center Cw of the polishing target object 1102 held by the top ring 1116 while the polishing target object 1102 is being polished. Reference character $C_T$ denotes the center of rotation of the polishing table 1110. For example, the eddy current sensor 1210 is adopted to enable the thickness of the polishing target object 1102 to be continuously detected on a passage locus (scanning line) while the eddy current sensor 1210 is passing below the polishing target object 1102.

Figure 13A:
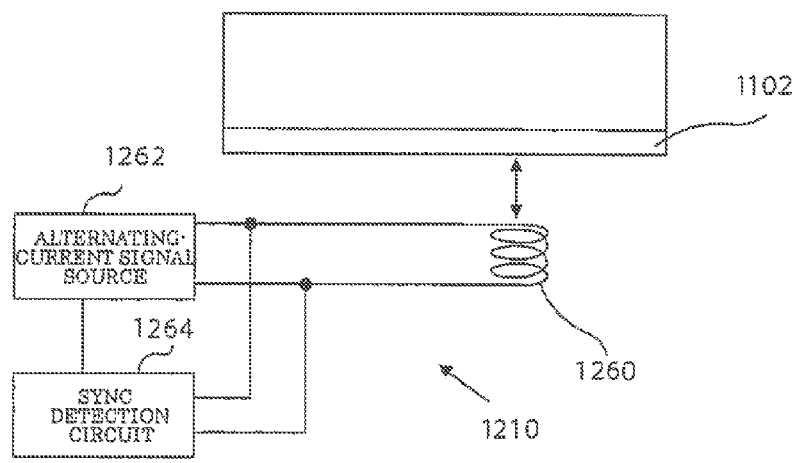
FIG. 13A is a block diagram showing the configuration of the eddy current sensor 1210.
Figure 13B:
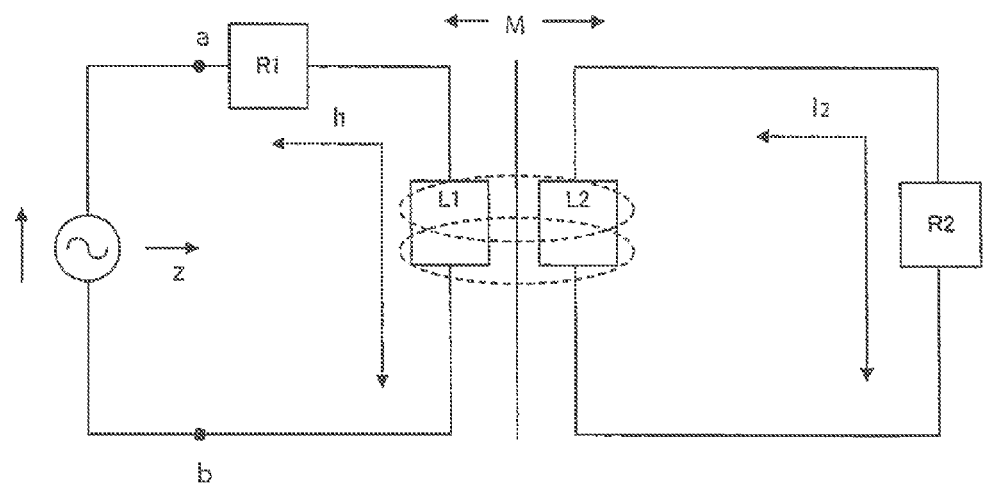
FIG. 13B is an equivalent circuit diagram of the eddy current sensor 1210.

FIGS. 13A and 13B are diagrams showing a configuration of the eddy current sensor 1210. FIG. 13A is a block diagram showing the configuration of the eddy current sensor 1210. FIG. 13B is an equivalent circuit diagram of the eddy current sensor 1210.

As shown in FIG. 13A, the eddy current sensor 1210 is provided with a sensor coil 1260 disposed in the vicinity of the polishing target object 1102, e.g., a metal film to be detected. An alternating-current signal source 1262 is connected to the sensor coil 1260. The polishing target object 1102 to be detected is, for example, a thin film of Cu, Al, Au or W formed on the semiconductor wafer. The sensor coil 1260 is disposed in the vicinity of the polishing target object 1102 to be detected, for example, at a distance of about 0.5 to 5.0 mm therefrom.

The eddy current sensor 1210 may be of a frequency type such that a conductive film is detected on the basis of a change in oscillation frequency of the alternating-current signal source 1262 due to occurrence of an eddy current in the polishing target object 1102. The eddy current sensor 1210 may alternatively be of an impedance type such that a conductive film is detected on the basis of a change in impedance seen from the alternating-current signal source 1262 due to occurrence of an eddy current in the polishing target object 1102. That is, in the case of the frequency type, impedance Z in the equivalent circuit shown in FIG. 13B is changed when eddy current $I_2$ is changed, resulting in a change in oscillation frequency of the alternating-current signal source (variable frequency oscillator) 1262. The eddy current sensor 1210 can detect the change in the conductive film by detecting the change in oscillation frequency with a detection circuit 1264. In the case of the impedance type, impedance Z in the equivalent circuit shown in FIG. 13B is changed when eddy current $I_2$ is changed, resulting in a change in impedance Z seen from the alternating-current signal source (fixed frequency oscillator) 1262. The eddy current sensor 1210 can detect the change in the conductive film by detecting the change in impedance Z with the detection circuit 1264.

Prom the impedance-type eddy current sensor, signal outputs X and Y, a phase and resultant impedance Z are taken out. Information on the measurement on the conductive film is obtained from frequency F or impedances X and Y for example. The eddy current sensor 1210 can be incorporated in the polishing table 1110 at a position in the vicinity of the surface, as shown in FIG. 11, and is capable of detecting the change in the conductive film from the eddy current flowing in the polishing target object 1102 when located so as to face the polishing target object 1102 through the polishing pad 1108.

The impedance-type eddy current sensor will be concretely described below. The alternating-current signal source 1262 is an oscillator of a fixed frequency of about 1 to 50 MHz. A crystal oscillator for example is used as the impedance-type eddy current sensor. Current $I_1$ is caused to flow through the sensor coil 1260 by an alternating-current voltage supplied from the alternating-current signal source 1262. With the current flowing through the sensor coil 1260 disposed in the vicinity of the polishing target object 1102, a magnetic flux generated from the sensor coil 1260 intersects the polishing target object 1102. As a result, mutual conductance M is formed between the sensor coil 1260 and the polishing target object 1102 and eddy current $I_2$ flows through the polishing target object 1102. R1 denotes a resistance on the primary side including the sensor coil 1260. Similarly, $L_1$ denotes self-inductance on the primary side including the sensor coil 1260. R2 denotes a resistor on the polishing target object 1102 side, which corresponds to eddy-current loss. $L_2$ denotes self-inductance of the polishing target object 1102. Impedance Z on the sensor coil 1260 side seen from terminals a and b of the alternating-current signal source 1262 changes under the influence of lines of magnetic force generated by eddy current $I_2$.

Figure 14:
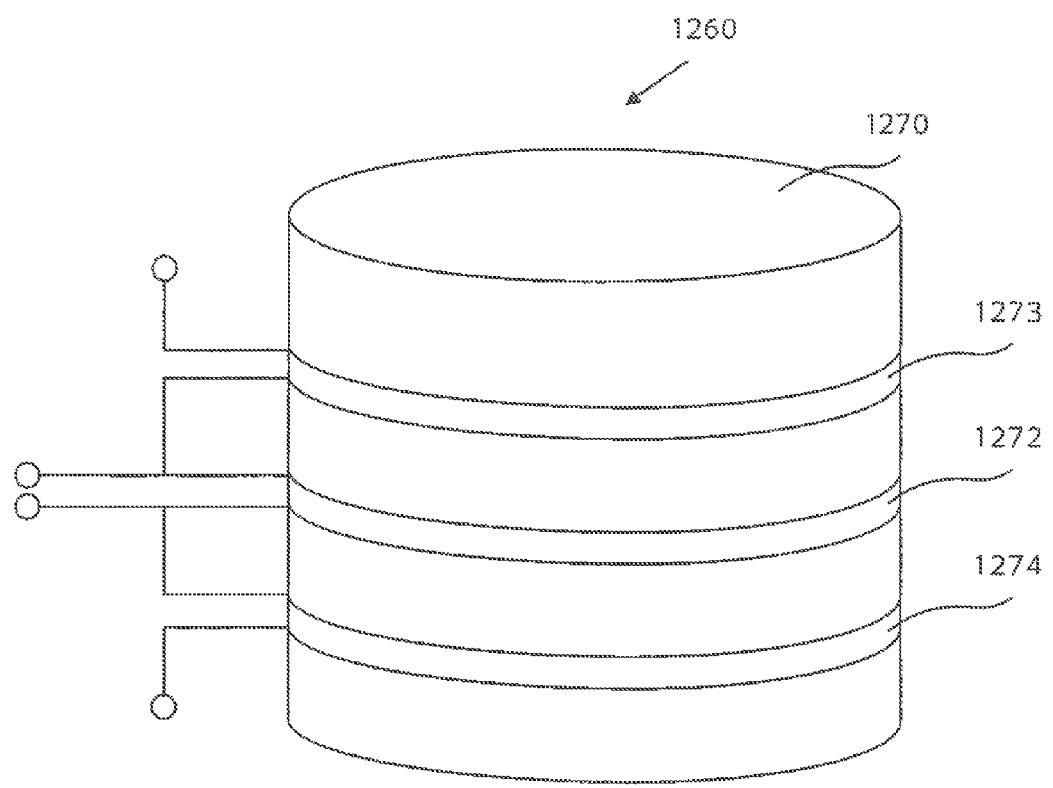
FIG. 14 is a schematic diagram showing an example of a configuration of the sensor coil used in the eddy current sensor in the present embodiment.

FIG. 14 is a schematic diagram showing an example of a configuration of the sensor coil used in the eddy current sensor according to the present invention. As shown in FIG. 14, the sensor coil 1260 of the eddy current sensor includes three coils 1272, 1273, and 1274 wound around a bobbin 1270. The coil 1272 is an excitation coil connected to the alternating-current signal source 1262. The excitation coil 1272 is excited by the alternating current supplied from the alternating-current signal source 1262 to form an eddy current in polishing target object 1102 disposed in the vicinity thereof. The detection coil 1273 is disposed on the polishing target object 1102 side of the bobbin 1270 to detect a magnetic field generated due to the eddy current formed in the polishing target object 1102. The balance coil 1274 is disposed opposite from the detection coil 1273, with the excitation coil 1272 interposed therebetween.

The coils 1272, 1273, and 1274 are formed of coils whose numbers of turns are equal to each other. The detection coil 1273 and the balance coil 1274 are connected in phase opposition to each other. When the polishing target object 1102 exits in the vicinity of the detection coil 1273, a magnetic flux caused by the eddy current formed in the polishing target object 1102 intersects the detection coil 1273 and the balance coil 1274. At this time, since the detection coil 1273 is disposed at a position closer to the conductive film, induced voltages generated in the two coils 1273 and 1274 are unbalanced, thereby enabling detection of the intersecting magnetic flux formed by the eddy current flowing in the conductive film.

Figure 15:
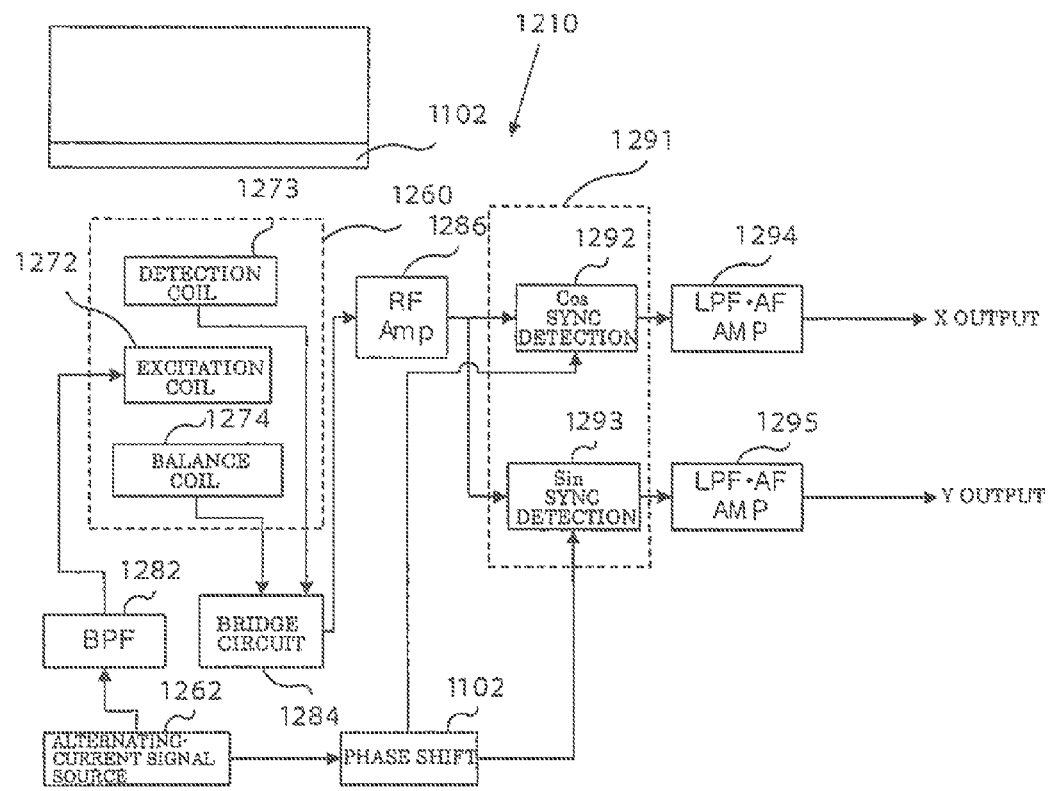
FIG. 15 is a schematic diagram showing details of the circuit arrangement of the eddy current sensor.

FIG. 15 is a schematic diagram showing details of the configuration of the eddy current sensor. The alternating-current signal source 1262 has an oscillator of a fixed frequency such as a crystal oscillator and supplies an alternating current having a fixed frequency of, for example, 1 to 50 MHz to the sensor coil 1260. The alternating current formed in the alternating-current signal source 1262 is supplied to the sensor coil 1260 (excitation coil 1272) through a band-pass filter (BPF) 1282. On the other hand, signals output from the terminals of the sensor coil 1260 (detection coil 1273 and balance coil 1274) are sent to a sync detection section 1291 including a cos sync detection circuit 1292 and a sin sync detection circuit 1293 via a bridge circuit 1284 and a radiofrequency amplifier (RF Amp) 1286. The resistance component and the induction reactance component of the impedance are taken out in the sync detection section 1291.

From the resistance component and the induction reactance component output from the sync detection section 1291, unnecessary high-frequency components (e.g., high-frequency components having frequencies equal to or higher than 5 kHz) are removed by low-pass filters (LPF·AF AMPs)

1294 and 1295, thereby outputting signals X and Y as the resistance component and the induction reactance component, respectively, of the impedance.

The end point detection section 1220 monitors changes in film thickness based on signals X and Y output from the eddy current sensor 1210.

Figure 16:
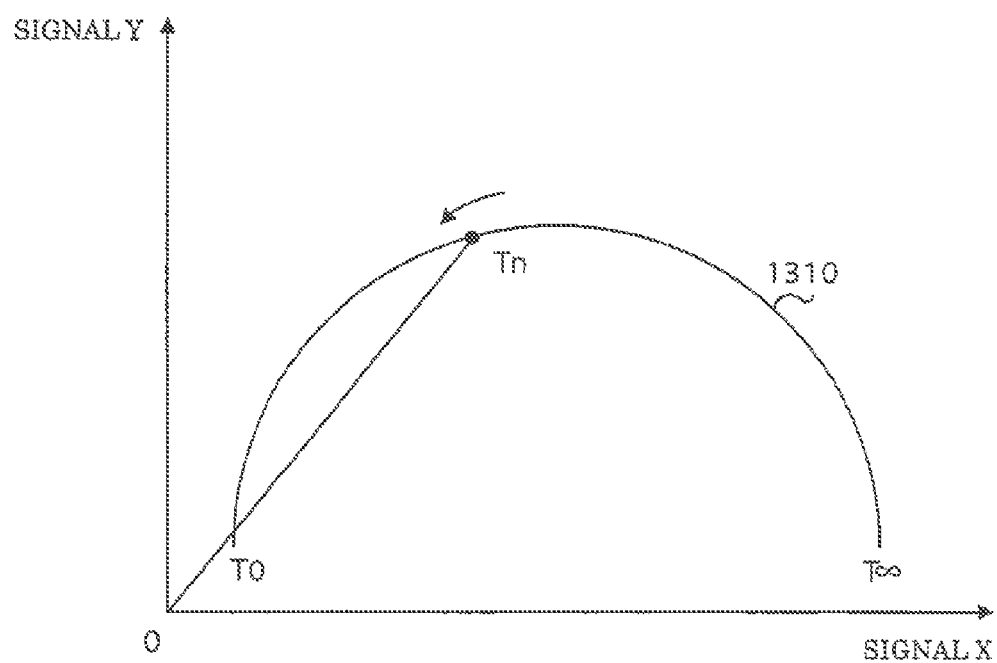
FIG. 16 shows an outline of processing performed by an end point detection section.
Figure 17:
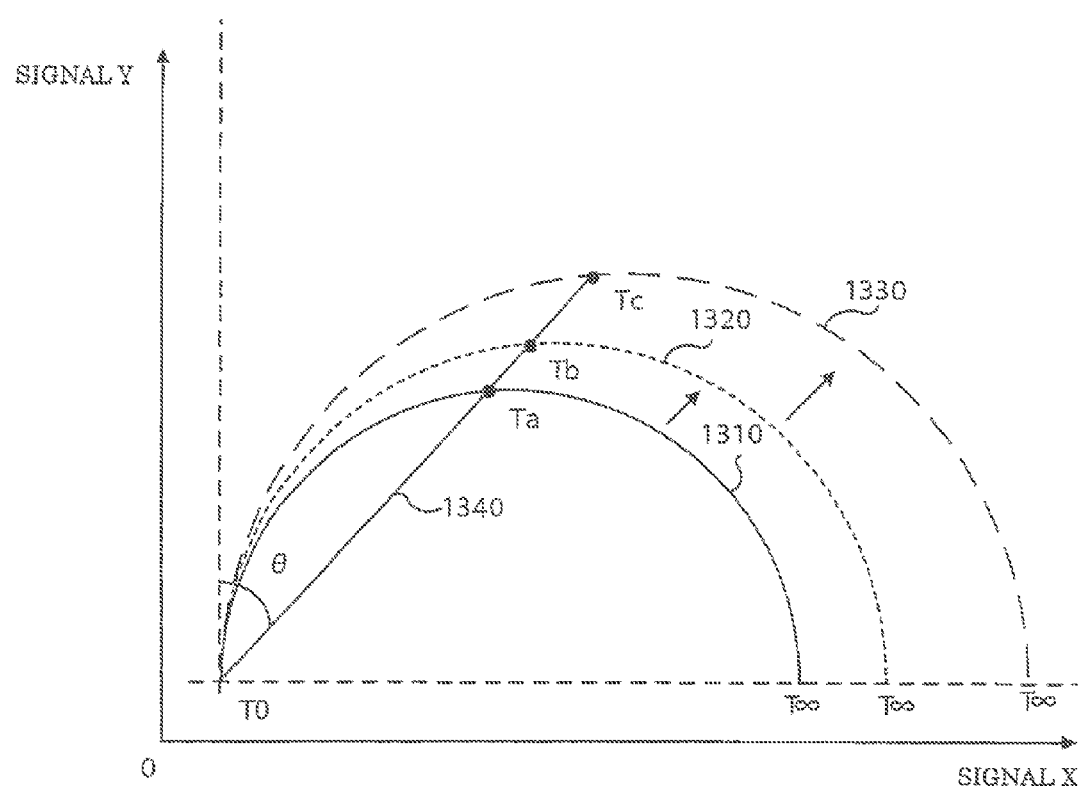
FIG. 17 shows an outline of processing performed by the end point detection section.

FIGS. 16 and 17 are diagrams showing an outline of processing with the end point detection section 1220. In FIG. 16, the abscissa represents the intensity of the signal X while the ordinate represents the intensity of the signal Y. Point T∞ on a circular arc 1310 indicates a state where the film thickness of the polishing target object 1102 is ∞, and point T0 indicates a state where the film thickness of the polishing target object 1102 is 0. With reduction in film thickness of the polishing target object 1102, point Tn on the circular arc 1310 positioned from the values of the signals X and Y moves toward point T0 while generating a circular-arc locus. Distance $Z (=(X^2+Y^2)^{1/2})$ from the origin O of the XY coordinate system to point Tn is reduced with reduction in film thickness except in the vicinity of point T∞.

Prom one viewpoint of film thickness measurement, the end point detection section 1220 computes the distance Z that changes according to the film thickness of the polishing target object 1102. The end point detection section 1220 can detect the film thickness of the polishing target object 1102 during polishing by monitoring the distance Z if it grasps the relationship between the distance Z and the film thickness of the polishing target object 1102 empirically or by testing.

In actuality, however, when polishing of the polishing target object 1102 is executed, the polishing target object 1102 is polished to be reduced in thickness and the polishing pad 1108 is also reduced in thickness. With reduction in thickness of the polishing pad 1108, the distance between the eddy current sensor 1210 and the polishing target object 1102 is reduced, so that the output from the eddy current sensor 1210 is increased. As a result, with reduction in thickness of the polishing pad 1108, the circular arc is increased, as indicated by circular arcs 1310, 1320 and 1330 in FIG. 17. In a case where the thickness of the polishing pad 1108 changes, therefore, it is difficult to detect the film thickness of the polishing target object 1102 on the basis of the distance Z in the above-described way.

Referring to FIG. 17, points of intersections Ta, Tb, and Tc at which a straight line 1340 connecting the point determined by the signals X and Y and the end point T0 intersects circular arcs 1310, 1320, and 1330 indicates that the film thickness of the polishing target object 1102 is constant. From a consideration of this point, the end point detection section 1220 obtains the angle θ between the straight line 1340 and a straight line extending from the end point T0 in the same direction as the signal Y axis. The end point detection section 1220 can detect the film thickness of the polishing target object 1102 during polishing by monitoring the angle θ if it grasps the relationship between the angle θ and the film thickness of the polishing target object 1102 empirically or by testing.

The end point detection section 1220 is connected to the polishing device control unit 1140 that performs various sorts of control relating to the polishing device 1100. When the end point detection section 1220 detects an end point of polishing of the polishing target object 1102 on the basis of the computed angle θ, it outputs to the polishing device control unit 1140 a signal indicating the detected end point. The polishing device control unit 1140 receives the signal indicating the polishing end point from the end point detection section 1220 and stops polishing with the polishing device 1100.

<Improvement of Measuring Accuracy of Eddy Current Sensor>

Improvement of the measuring accuracy of the eddy current sensor according to the present embodiment will be described next. Degradation in measuring accuracy of the eddy current sensor 1210 due to a response of the sensor acting as a capacitive sensor.

Figure 18A:
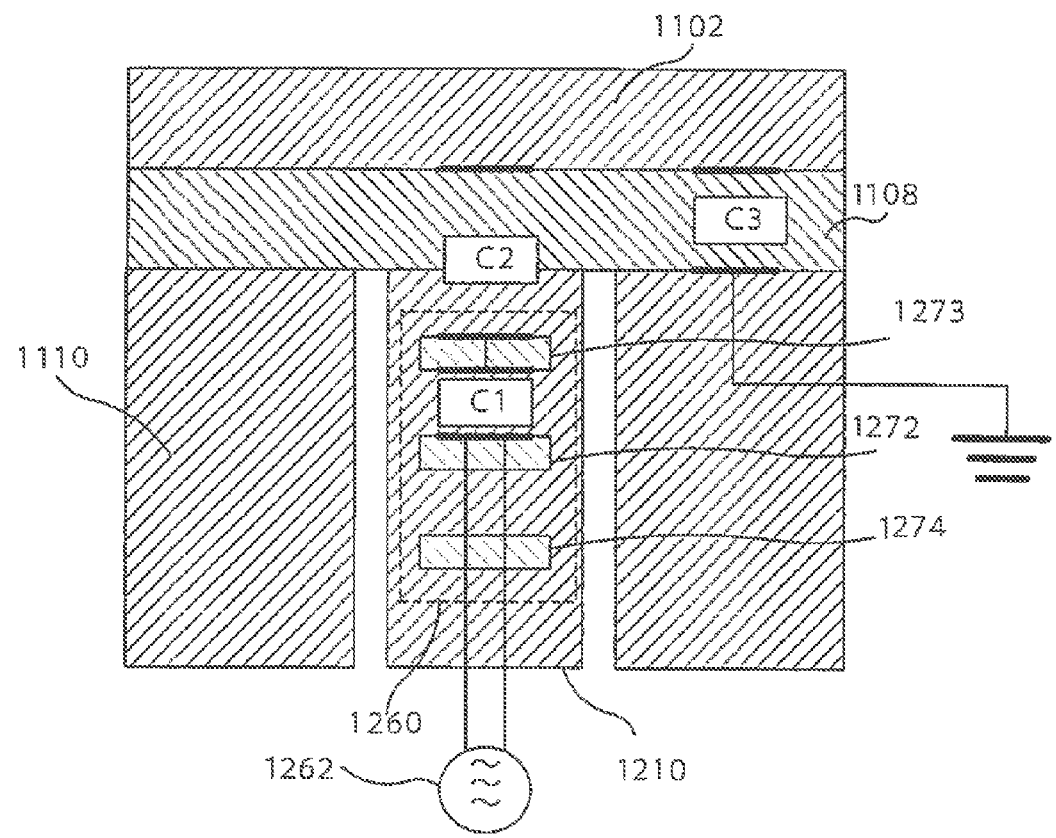
FIG. 18A is a schematic diagram showing electrostatic capacities in a case where the eddy current sensor responds as a capacitive sensor in the conventional arrangement.
Figure 18B:
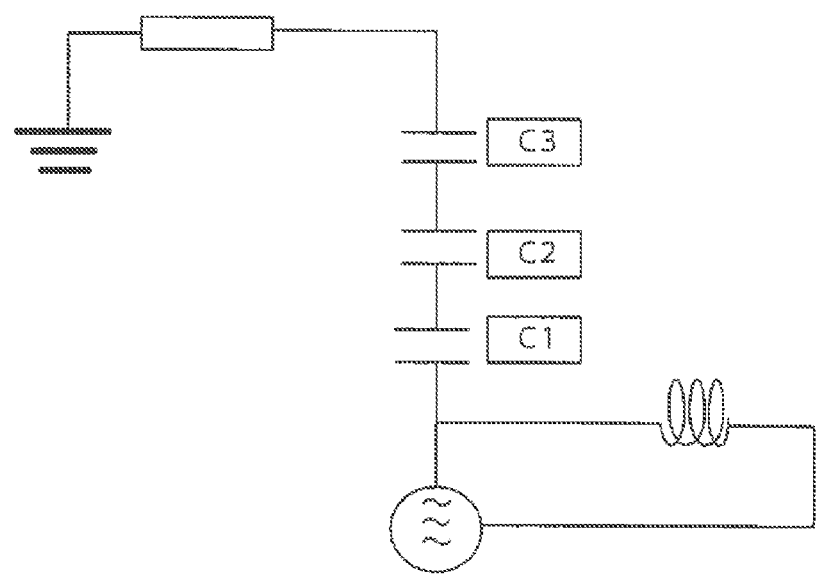
FIG. 18B is an equivalent circuit diagram of the arrangement shown in FIG. 18A.

FIGS. 18A and 18B are diagrams for explaining electrostatic capacities in a conventional eddy current sensor. FIG. 18A is a schematic diagram showing electrostatic capacities in a case where the eddy current sensor responds as a capacitive sensor in the conventional arrangement. FIG. 18B is an equivalent circuit diagram of the arrangement shown in FIG. 18A. As shown in FIGS. 18A and 18B, an electrostatic capacity C1 between the excitation coil 1272 and the detection coil 1273, an electrostatic capacity C2 between the detection coil 1273 and the polishing target object 1102 and an electrostatic capacity C3 between the polishing target object 1102 and the polishing table 1110 are present between the eddy current sensor 1210 and ground (earth). A resultant electrostatic capacity C between the eddy current sensor 1210 and ground (earth) is expressed by the following equation 1:

$$C = \frac{1}{\frac{1}{C1} + \frac{1}{C2} + \frac{1}{C3}} \quad \text{[Formula 1]}$$

Figure 19:
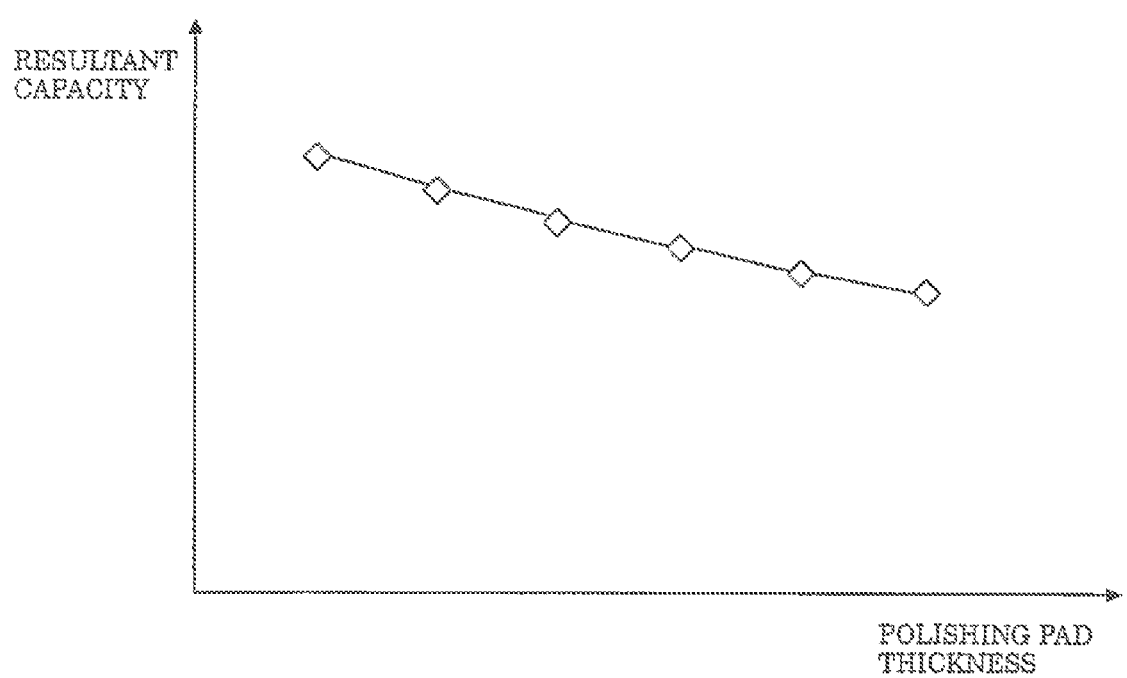
FIG. 19 shows changes in the resultant electrostatic capacity with respect to changes in thickness of the polishing pad in the conventional eddy current sensor.
Figure 20:
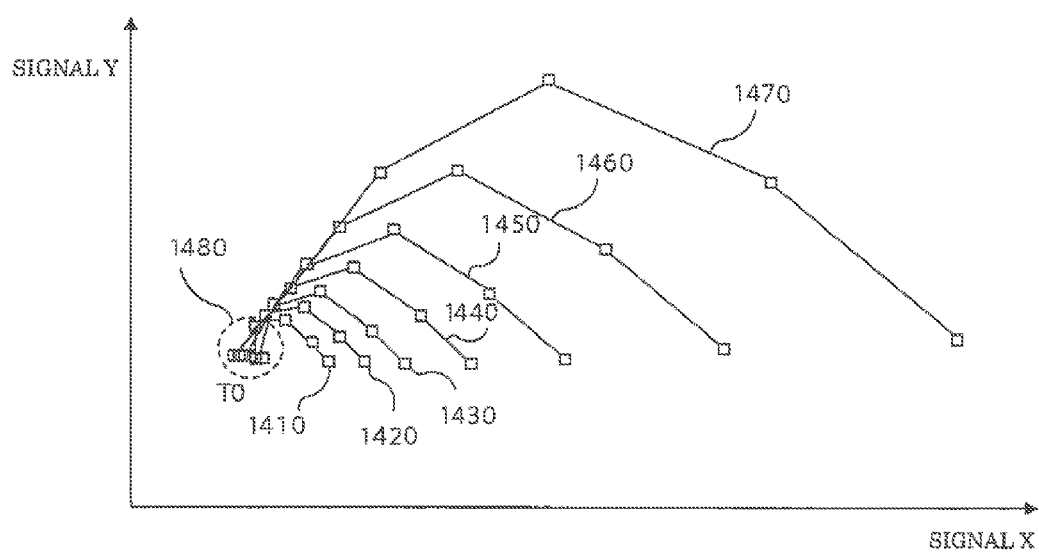
FIG. 20 shows plotted data on signals X and Y measured with the conventional eddy current sensor.

FIG. 19 shows changes in the resultant electrostatic capacity with respect to changes in thickness of the polishing pad in the conventional eddy current sensor. In FIG. 19, the abscissa represents the thickness of the polishing pad 1108 and the coordinate presents the resultant electrostatic capacity C between the eddy current sensor 1210 and ground (earth). FIG. 20 shows plotted data on the signals X and Y measured with the conventional eddy current sensor. In FIG. 20, the abscissa represents the signal X and the ordinate represents the signal Y.

As shown in FIG. 19, the resultant electrostatic capacity C increases largely as the thickness of the polishing pad 1108 is reduced by the polishing process. As a result, ends points T0 of circular arcs 1410 to 1470 corresponding to the thickness of the polishing pad 1108 do not converge, as indicated by dotted circle 1480 in FIG. 20. The reference point for detecting the angle θ is thus shifted with change in thickness of the polishing pad 1108, so that the angle θ cannot be detected with high accuracy, resulting in degradation in the accuracy of measurement of the film thickness of the polishing target object 1102.

<Arrangement for Improving the Measuring Accuracy>

To cope with this problem, in the present embodiment, the eddy current sensor 1210 is provided with an electrically conductive member 1500 disposed on the measuring object side of the sensor coil 1260 (including the excitation coil 1272, the detection coil 1273 and the balance coil 1274).

Figure 21A:
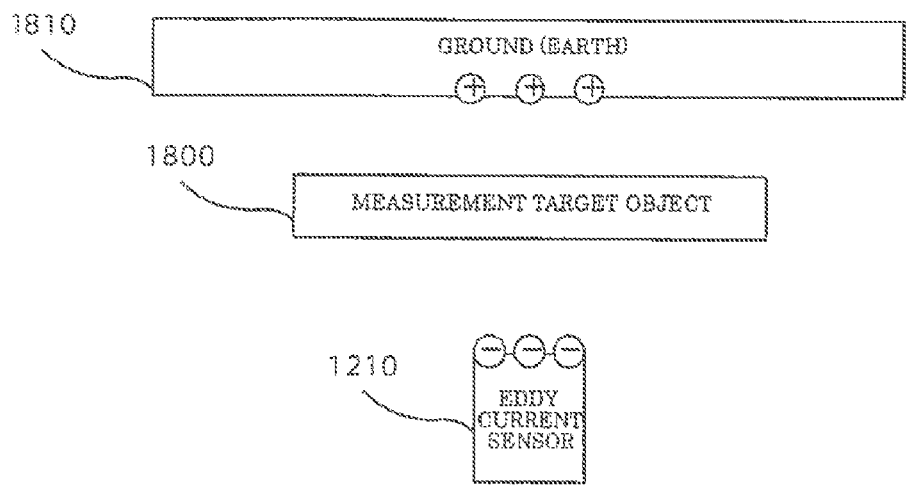
FIG. 21A is a concept diagram for explaining an effect produced by disposing a conductive member.
Figure 21B:
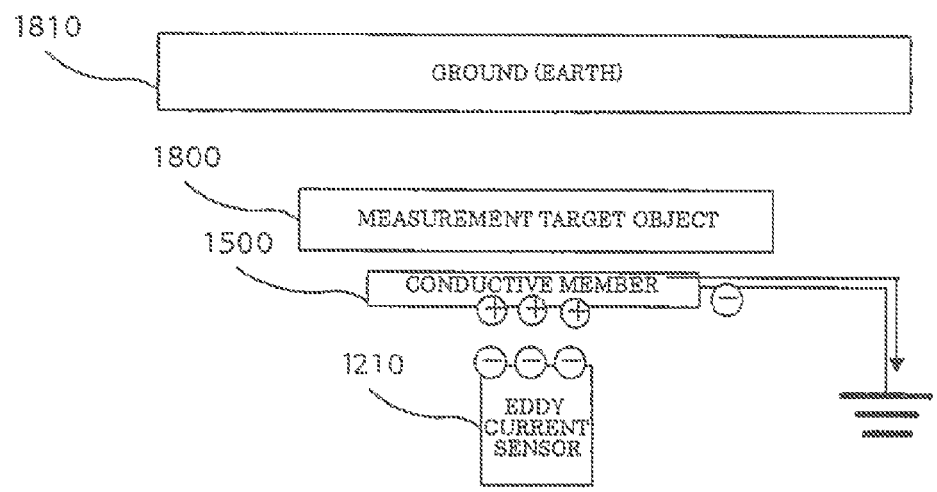
FIG. 21B is a concept diagram for explaining the effect produced by disposing the conductive member.
Figure 21C:
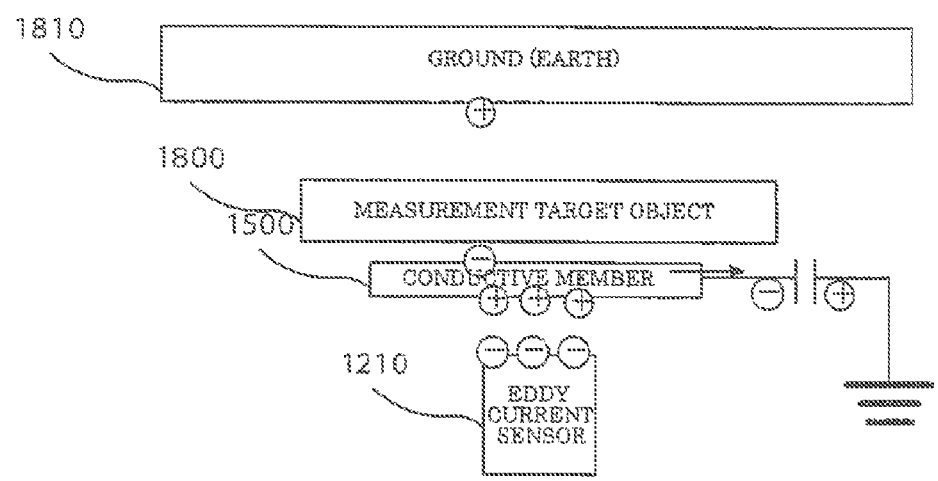
FIG. 21C is a concept diagram for explaining the effect produced by disposing the conductive member.

Description will be made of this point. FIGS. 21A, 21B, and 21C are concept diagrams for explaining an effect produced by disposing the conductive member 1500. In a case such as shown in FIG. 21A, where the conductive member 1500 is not disposed between the eddy current sensor 1210 and a measurement target object 1800 (e.g., polishing target object 102), the electrostatic capacity between the eddy current sensor 1210 and ground 1810 (earth) is changed if the distance between the eddy current sensor 1210 and ground 1810 (earth) is changed. As a result, a change in electrostatic capacity between the eddy current sensor 1210 and ground 1810 (earth) directly influences the output from the eddy current sensor 1210, thereby changing the output from the eddy current sensor 1210.

To cope with this, the conductive member 1500 is disposed between the eddy current sensor 1210 and the measurement target object 1800, as shown in FIG. 21B. The conductive member 1500 is formed of a material which has an electrical conductivity lower than that of the measurement target object 1800, and which is not an insulating material. Also, the conductive member 1500 is grounded, as shown in FIG. 21B, so that a large electrostatic capacity is provided between the eddy current sensor 1210 and ground.

Because of the disposition of the conductive member 1500, an electric field is generated between the eddy current sensor 1210 and the conductive member 1500. While electric charge is generated on the lower surface of the conductive member 1500, electric charge is not easily generated on the upper surface since the conductive member 1500 is disposed. Therefore, substantially no electric field is generated between the conductive member 1500 and the measurement target object 1800, thereby inhibiting the eddy current sensor 1210 from operating as a capacitive sensor. Even if the distance between the eddy current sensor 1210 and the measurement target object 1800 is changed, the distance between the eddy current sensor 1210 and the conductive member 1500 is constant. A constant electrostatic capacity is produced between the eddy current sensor 1210 and the conductive member 1500, thus enabling limiting of the influence of variation in electrostatic capacity caused between the conductive member 1500 and the measurement target object 1800. Since an alternating current power supply is ordinarily used for the eddy current sensor 1210, grounding through a capacitor in a way shown in FIG. 21C may be performed instead of grounding in the way shown in FIG. 21B to enable the conductive member 1500 to have a sufficiently large electrostatic capacity. The same effect can also be obtained in this way.

<Concrete Mode of Disposition of Conductive Member 1500>

Figure 22:
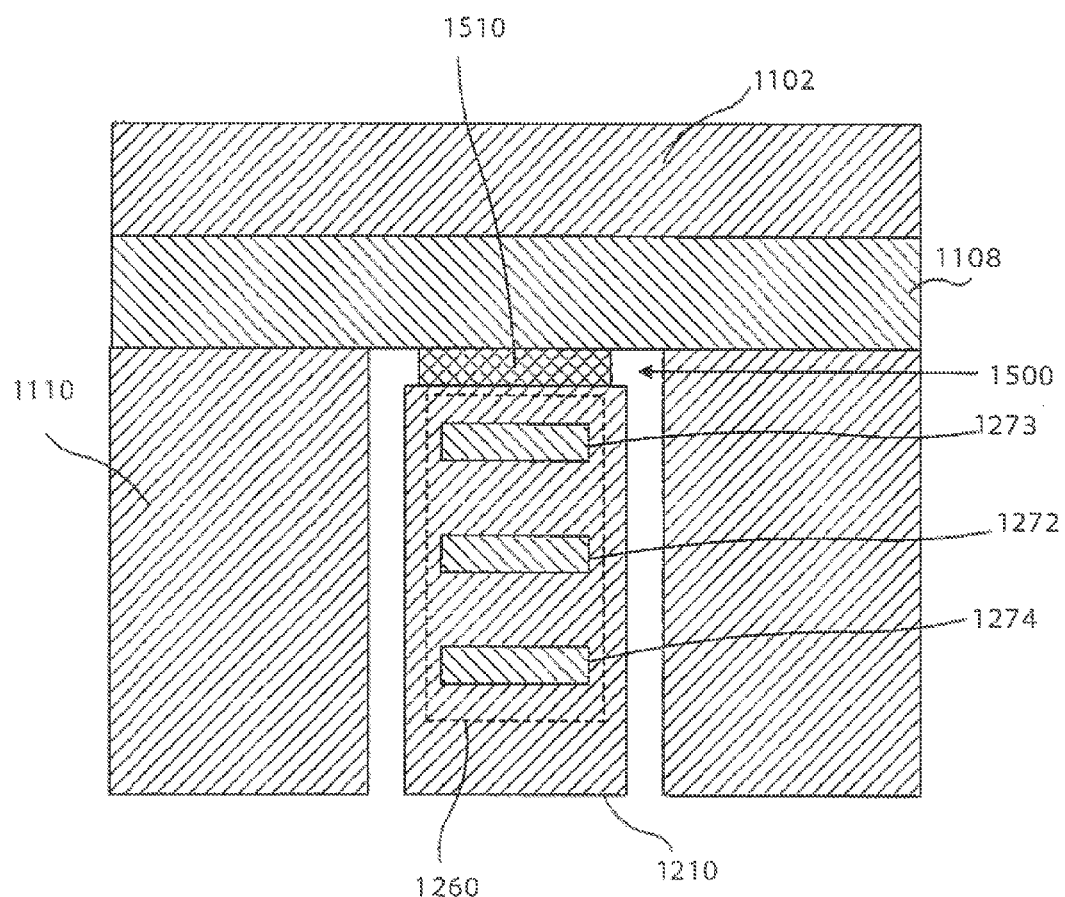
FIG. 22 shows an example of a configuration of the eddy current sensor in the present embodiment.

A mode of disposition of the conductive member 1500 will be concretely described. FIG. 22 shows an example of a configuration of the eddy current sensor 1210 in the present embodiment. As shown in FIG. 22, the eddy current sensor 1210 in the present embodiment is provided with the conductive member 1500. The conductive member 1500 is disposed on the measurement target object (polishing target object 1102) side of the sensor coil 1260 (including the excitation coil 1272, the detection coil 1273 and the balance coil 1274).

More specifically, the conductive member 1500 is disposed between the sensor coil 1260 and an insulating member (polishing pad 1108) interposed between the measurement target object (polishing target object 1102) and the sensor coil 1260. The conductive member 1500 may have at least an opposed portion 1510 opposed to the sensor coil 1260. The opposed portion 1510 has a surface intersecting the coil axis of the excitation coil 1272, the detection coil 1273 or the balance coil 1274, thereby facing the sensor coil 1260.

Figure 23:
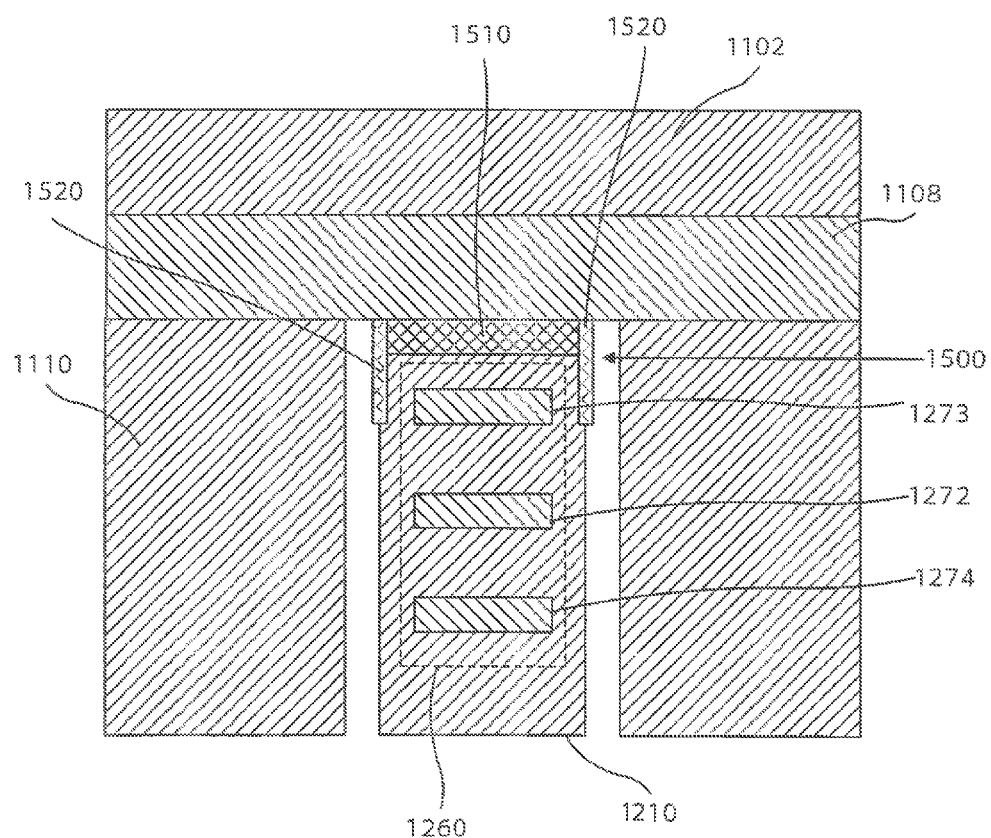
FIG. 23 shows another example of the configuration of the eddy current sensor in the present embodiment.

FIG. 23 shows another example of the configuration of the eddy current sensor 1210 in the present embodiment. The conductive member 1500 may have, as shown in FIG. 23, the opposed portion 1510 opposed to the sensor coil 1260 and a peripheral portion 1520 connected to the opposed portion 1510 and covering at least a part of the periphery of the sensor coil 1260. In this example, the peripheral portion 1520 is opposed to the inner wall surface of the hole formed in the polishing table 1110.

Figure 24:
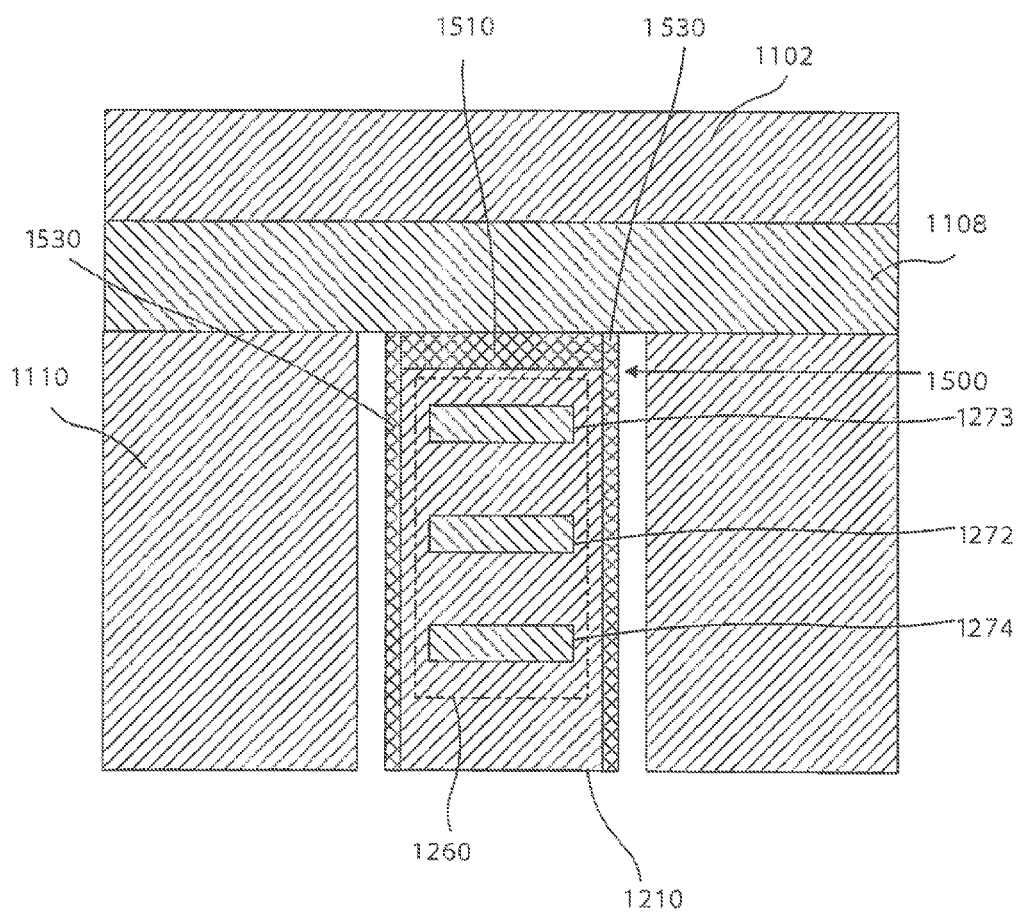
FIG. 24 shows yet another example of the configuration of the eddy current sensor in the present embodiment.

FIG. 24 shows yet another example of the configuration of the eddy current sensor 1210 in the present embodiment. The conductive member 1500 may have, as shown in FIG. 24, the opposed portion 1510 opposed to the sensor coil 1260 and a peripheral portion 1530 connected to the opposed portion 1510 and covering the entire periphery of the sensor coil 1260 and may be formed into the shape of a cap to be fitted around the sensor coil 1260. In this example, the peripheral portion 1530 is opposed to the inner wall surface of the hole formed in the polishing table 1110.

Figure 25:
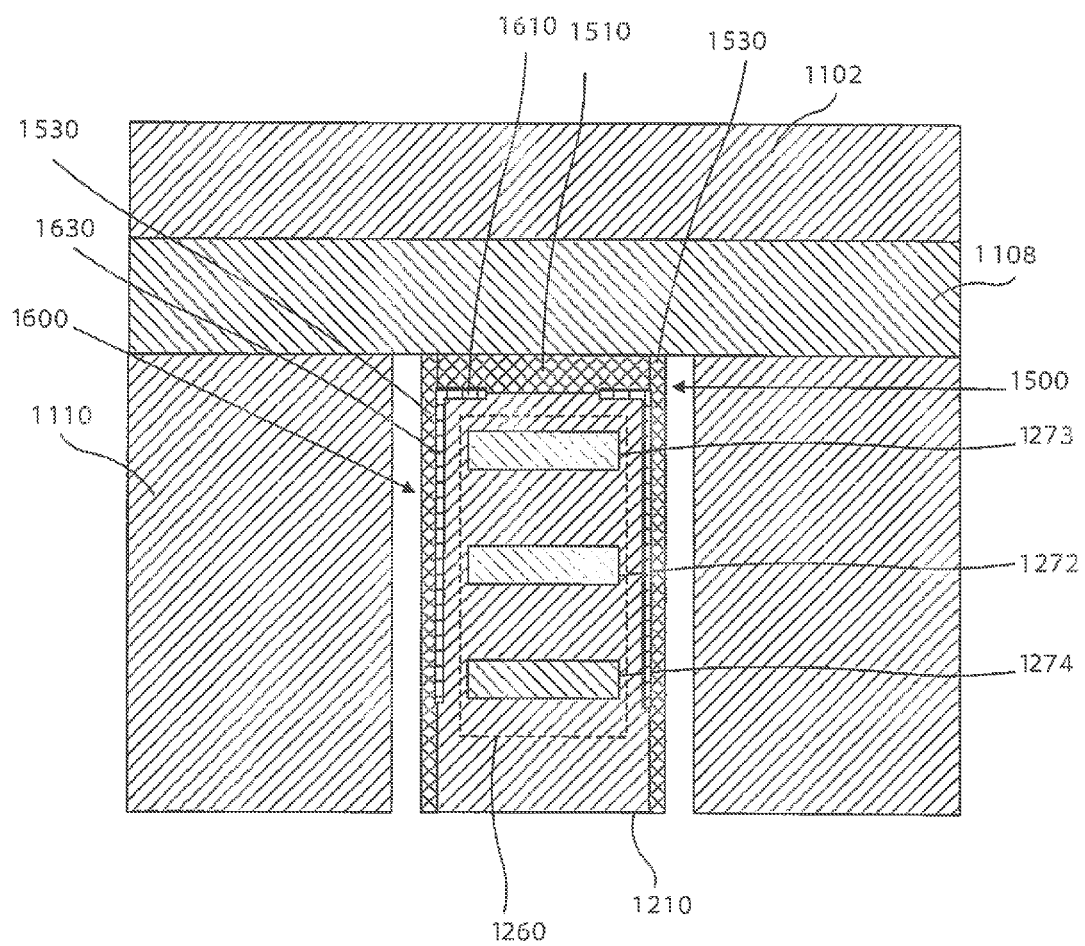
FIG. 25 shows still another example of the configuration of the eddy current sensor in the present embodiment.

FIG. 25 shows still another example of the configuration of the eddy current sensor 1210 in the present embodiment. The conductive member 1500 has, as shown in FIG. 25, the opposed portion 1510 opposed to the sensor coil 1260 and the peripheral portion 1530 connected to the opposed portion 1510 and covering the entire periphery of the sensor coil 1260 and may be formed into the shape of a cap to be fitted around the sensor coil 1260, as does that in FIG. 24.

The eddy current sensor 1210 has another additional component: a magnetic shield sheet 1600 as an edge corner countermeasure. The magnetic shield sheet 1600 has an opposed portion 1610 opposed to the sensor coil 1260 and a peripheral portion 1630 connected to the opposed portion 1610 and covering the entire periphery of the sensor coil 1260 and is formed into the shape of a cap to be fitted around the sensor coil 1260, as is the conductive member 1500. The magnetic shield sheet 1600 is fitted around the sensor coil 1260 inside the conductive member 1500. An opening facing the sensor coil 1260 is formed in the opposed portion 1610 to enable a magnetic field to pass therethrough.

Referring to FIGS. 22 to 25, the opposed portion 1510 is disposed on the measurement target object (polishing target object 1102) side of the sensor coil 1260 at a predetermined distance from the sensor coil 1260. Also, the opposed portion 1510 is disposed at a predetermined distance from the measurement target object (polishing target object 1102). Further, the opposed portion 1510 is disposed between the sensor coil 1260 and the measurement target object (polishing target object 1102) so that the distance between the sensor coil 1260 and the opposed portion 1510 is smaller than the distance between the measurement target object (polishing target object 1102) and the opposed portion 1510. The distance between the sensor coil 1260 and the opposed portion 1510 is fixed. That is, even when the distance between the eddy current sensor 1210 (sensor coil 1260) and the polishing target object 1102 is changed, for example, with reduction in thickness of the polishing pad 1108, the distance between the eddy current sensor 1210 (sensor coil 1260) and the opposed portion 1510 is constant.

Each of the conductive members 1500 (opposed portion 1510) shown in FIGS. 22 to 25 can be formed by containing, for example, an electrically conductive polypropylene or a silicone resin. Also, each of the conductive members 1500 (opposed portion 1510) shown in FIGS. 22 to 25 can be formed, for example, of a member made of a synthetic resin such as polypropylene kneaded in the resin or silicone, a member made of a synthetic resin and covered with a vapor-deposited thin layer of a metal, a member made of glass and covered with a vapor-deposited thin layer of a metal, a member made of rubber (silicone or the like) and carbon kneaded in the rubber, or a monocrystalline silicon substrate (Si).

If the electrical resistivity of the conductive member 1500 (opposed portion 1510) is reduced, the effect of reducing the response of the eddy current sensor 1210 acting as a capacitive sensor can be improved but an eddy current is generated in the conductive member 1500, resulting in a reduction in sensitivity in measurement of the film thickness of the polishing target object 1102. On the other hand, if the electrical resistivity of the conductive member 1500 (opposed portion 1510) is excessively high, the effect of reducing the response of the eddy current sensor 1210 acting as a capacitive sensor is not sufficiently high. By considering these points, each of the conductive members 1500 (opposed portion 1510) shown in FIGS. 22 to 25 may be formed by including a material having an electrical resistivity of 1 Ω·cm to 100 Ω·cm. Preferably, each of the conductive members 1500 (opposed portion 1510) shown in FIGS. 22 to 25 is formed by including a material having an electrical resistivity of 5 Ω·cm to 50 Ω·cm. More preferably, each of the conductive members 1500 (opposed portion 1510) shown in FIGS. 22 to 25 is formed by including a material having an electrical resistivity of 7 Ω·cm to 20 Ω·cm.

On the other hand, each of the conductive members 1500 (peripheral portions 1520 and 1530) shown in FIGS. 23 to 25 may be formed by including the same material as that of the opposed portion 1510, and may alternatively be formed of an electrically conductive material such as a copper tape or SUS for example.

Figure 26A:
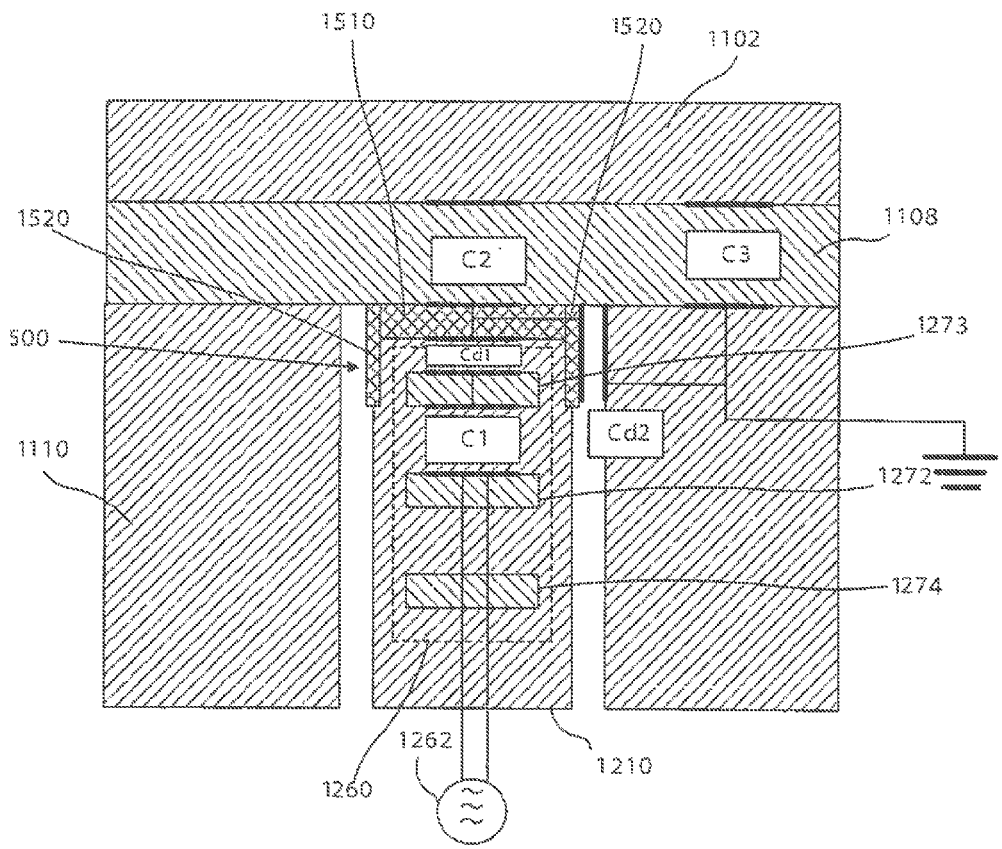
FIG. 26A is a schematic diagram showing electrostatic capacities in a case where the eddy current sensor responds as a capacitive sensor in the arrangement shown in FIG. 23.
Figure 26B:
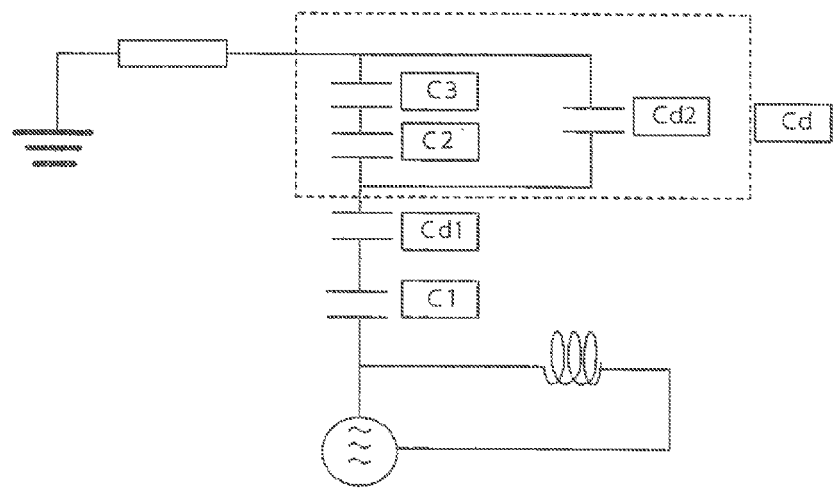
FIG. 26B is an equivalent circuit diagram of the arrangement shown in FIG. 26A.

The effect produced by disposing the conductive member 1500 will subsequently be described. FIGS. 26A and 26B are diagrams for explaining the electrostatic capacity of the eddy current sensor in the present embodiment. FIG. 26A is a schematic diagram showing electrostatic capacities in a case where the eddy current sensor responds as a capacitive sensor in the arrangement shown in FIG. 23. FIG. 26B is an equivalent circuit diagram of the arrangement shown in FIG. 26A. As shown in FIGS. 26A and 26B, an electrostatic capacity C1 between the excitation coil 1272 and the detection coil 1273, an electrostatic capacity Cd1 between the detection coil 1273 and the conductive member 1500, an electrostatic capacity C2' between the conductive member 1500 and the polishing target object 1102, an electrostatic capacity C3 between the polishing target object 1102 and the polishing table 1110 and an electrostatic capacity Cd2 between the conductive member 1500 and the polishing table 1110 are present between the eddy current sensor 1210 and ground (earth). A resultant electrostatic capacity Cd of the electrostatic capacity C2', the electrostatic capacity C3 and the electrostatic capacity Cd2 is expressed by equation 2 shown below. Also, the overall resultant electrostatic capacity C between the eddy current sensor 1210 and ground (earth) is expressed by equation 3 shown below.

$$Cd = \frac{1}{\frac{1}{C2' + C3} + \frac{1}{Cd2}} \quad \text{[Formula 2]}$$

$$C = \frac{1}{\frac{1}{C1} + \frac{1}{Cd1} + \frac{1}{Cd}} \quad \text{[Formula 3]}$$

Figure 27:
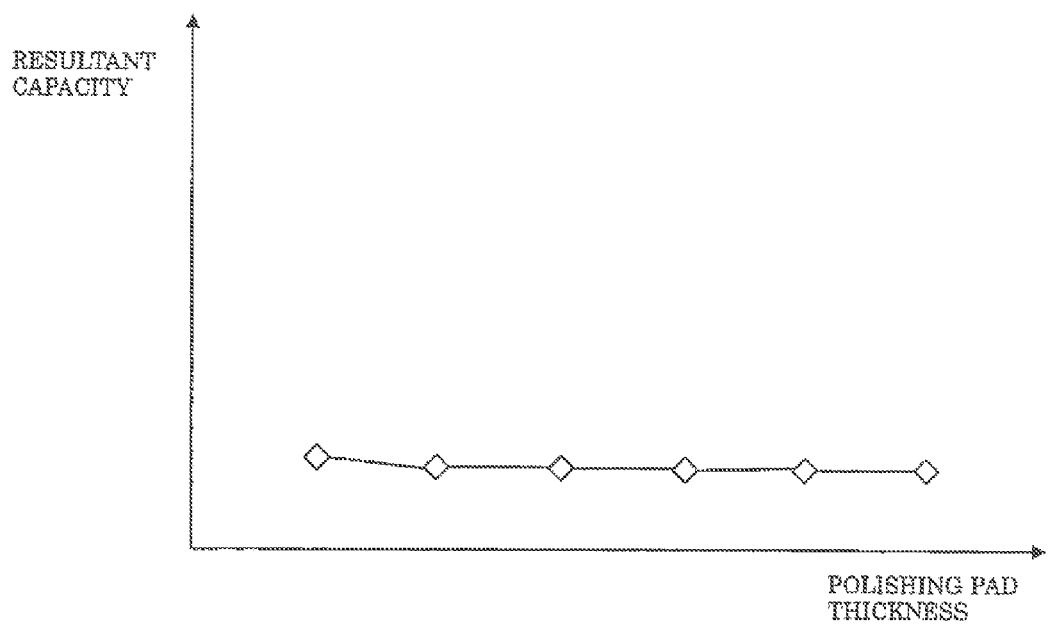
FIG. 27 shows changes in the resultant electrostatic capacity with respect to changes in thickness of the polishing pad in the eddy current sensor in the present embodiment.
Figure 28:
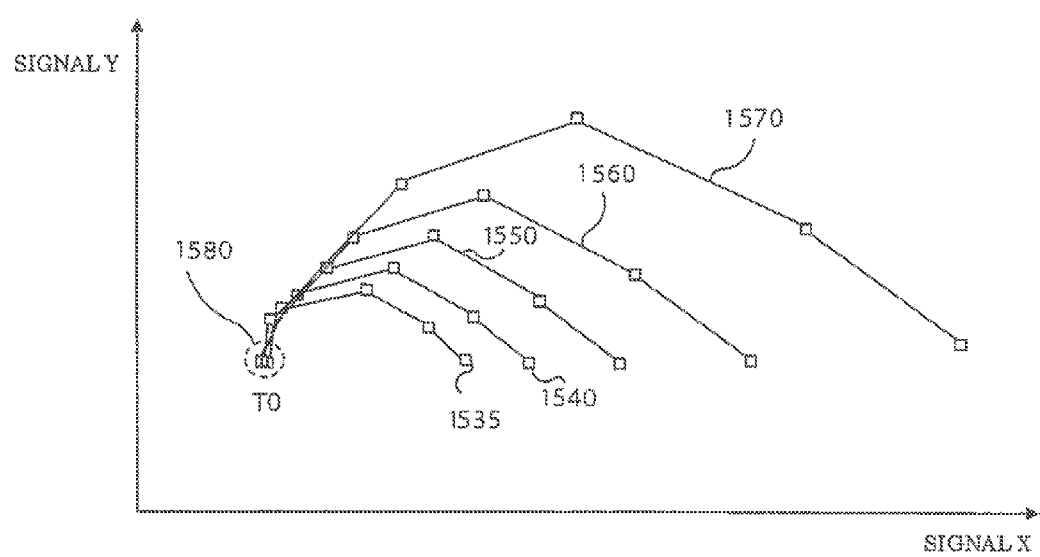
FIG. 28 shows plotted data on signals X and Y measured with the eddy current sensor in the present embodiment.

FIG. 27 shows changes in the resultant electrostatic capacity with respect to changes in thickness of the polishing pad in the eddy current sensor in the present embodiment. In FIG. 27, the abscissa represents the thickness of the polishing pad 1108 and the coordinate presents the resultant electrostatic capacity C between the eddy current sensor 1210 and ground (earth). FIG. 28 shows plotted data on the signals X and Y measured with the eddy current sensor in the present embodiment. In FIG. 28, the abscissa represents the signal X and the ordinate represents the signal Y.

As shown in FIG. 27, the resultant electrostatic capacity C does not change substantially even when the thickness of the polishing pad 1108 is reduced by the polishing process. For example, referring to FIG. 19, the resultant electrostatic capacity C was changed by 32% when the thickness of the polishing pad 1108 was changed from 3.0 mm to 0.5 mm. In contract, referring to FIG. 27, the resultant electrostatic capacity C was changed only by 0.006% when the thickness of the polishing pad 1108 was also changed from 3.0 mm to 0.5 mm. That is, the influence of changes in electrostatic capacities C' and C3 due to a change in thickness of the polishing pad 1108 on the resultant electrostatic capacity C was reduced by disposing the conductive member 1500 (changes in electrostatic capacities C' and C3 were not easily reflected in the output from the eddy current sensor 1210). In other words, since the distance between the sensor coil 1260 and the opposed portion 1510 is fixed, the distance between the eddy current sensor 1210 (sensor coil 1260) and the opposed portion 1510 is constant even when the thickness of the polishing pad 1108 is changed and when the distance between the eddy current sensor 1210 (sensor coil 1260) and the polishing target object 1102 is changed. Accordingly, the electrostatic capacity between the sensor coil 1260 and the opposed portion 1510 is not changed even when the distance between the eddy current sensor 1210 (sensor coil 1260) and the polishing target object 1102 is changed, thus reducing the influence of changes in electrostatic capacities C' and C3 due to a change in thickness of the polishing pad 1108 on the resultant electrostatic capacity C.

As a result, end points T0 of circular arcs 1535 to 1570 corresponding to the thickness of the polishing pad 1108 converge, as indicated by dotted circle 1580 in FIG. 28. Therefore, the reference point for detecting the angle θ is not substantially changed even when the thickness of the polishing pad 1108 is changed, thus enabling the angle θ to be detected with high accuracy. Consequently, in the present embodiment, the accuracy of measurement of the film thickness of the polishing target object 1102 can be improved.

While an example in which the polishing table 1110 is grounded has described, the present invention is not limited to the described example. The conductive member 1500 may be directly grounded as shown in FIG. 21B. Also, while an example in which the eddy current sensor 1210 is applied to the polishing device 1100 has been described, the present invention is not limited to the described example. As described above with reference to FIGS. 21A to 21C, the influence of changes in electrostatic capacity on the resultant electrostatic static capacity is reduced by disposing the conductive member 1500 between the eddy current sensor 1210 and the measurement target object 1800, thus improving the accuracy of measurement with the eddy current sensor 1210.

REFERENCE SIGNS LIST

100 Polishing device
102 Polishing target object
108 Polishing pad
110 Polishing table
140 Polishing device control unit
200 Polishing end point detection device
210 Eddy current sensor
220 End point detection device main unit
230 Film thickness corrector 232 Acquisition section
234 Computation section
236 Correction section
240 End point detection section
260 Sensor coil
A On-polishing-target-object region
B Out-of-polishing-target-object region
1100 Polishing device
1102 Polishing target object
1108 Polishing pad
1110 Polishing table
1210 Eddy current sensor
1220 End point detection section
1260 Sensor coil
1272 Excitation coil
1273 Detection coil
1274 Balance coil
1500 Conductive member
1510 Opposed portion
1520 Peripheral portion
1520, 1530 Peripheral portion
1600 Magnetic shield sheet
1610 Opposed portion
1630 Peripheral portion
1800 Measurement target object
1810 Ground

What is claimed is:

1. A method of correcting a film thickness measurement value in which a signal output from a sensor for measuring a film thickness of a polishing target object is corrected while a process of polishing the polishing target object is being performed, the polishing process including a first state where the sensor and the polishing target object do not face each other and a second state where the sensor and the polishing target object face each other, the method comprising:
   obtaining a first measurement signal output from the sensor in the first state;
   computing a correction value on the basis of the obtained first measurement signal and a reference signal set in advance with respect to the first measurement signal;
   obtaining a second measurement signal output from the sensor in the second state; and
   correcting the obtained second measurement signal on the basis of the computed correction value while the polishing process is being performed.

2. The method according to claim 1, wherein the reference signal is a signal output from the sensor in a state where the sensor and the polishing target object do not face each other when the polishing process is not being performed.

3. The method according to claim 1, wherein the polishing process includes polishing the polishing target object by pressing the polishing target object on a polishing pad for polishing the polishing target object while rotating a polishing table to which the polishing pad is attached,
   the sensor is set in the polishing table,
   the first state and the second state appear alternately with the rotation of the polishing table, and
   correcting the second measurement signal is performed by correcting the second measurement signal obtained in the second state on the basis of a correction value computed on the basis of the first measurement signal obtained in the first state immediately before the second state and the reference signal.

4. The method according to claim 1, wherein the reference signal is a signal output from the sensor in a state where the sensor and the polishing target object do not face each other when calibration of the sensor is being performed.

5. The method according to claim 1, wherein the reference signal is a signal output from the sensor in a state where the sensor and the polishing target object do not face each other at an ambient temperature observed when the polishing process is not being performed.

6. The method according to claim 1, wherein the sensor is an eddy current sensor.

7. A film thickness corrector configured to correct a signal output from a sensor for measuring a film thickness of a polishing target object while a process of polishing the polishing target object is being performed, the polishing process including a first state where the sensor and the polishing target object do not face each other and a second state where the sensor and the polishing target object face each other, the film thickness corrector comprising:
   an acquisition section configured to obtain a first measurement signal output from the sensor in the first state and a second measurement signal output from the sensor in the second state;
   a computation section configured to compute a correction value on the basis of the first measurement signal obtained by the acquisition section and a reference signal set in advance with respect to the first measurement signal; and
   a correction section configured to correct the second measurement signal obtained by the acquisition section on the basis of the correction value computed by the computation section while the polishing process is being performed.

8. An eddy current sensor configured to measure a distance to a measurement target object or a film thickness of the measurement target object, the eddy current sensor comprising:
   a sensor coil configured to generate an eddy current in the measurement target object, and detect an induced magnetic field derived from generation of the eddy current; and
   an electrically conductive member disposed on the measurement target object side of the sensor coil.

9. The eddy current sensor according to claim 8, wherein the electrically conductive member has an opposed portion opposed to the sensor coil.

10. The eddy current sensor according to claim 9, wherein the electrically conductive member further has a peripheral portion connected to the opposed portion and covering at least part of a periphery of the sensor coil.

11. The eddy current sensor according to claim 8, wherein the electrically conductive member is formed into a shape of a cap fitted around the sensor coil.

12. The eddy current sensor according to claim 8, wherein the electrically conductive member is formed by containing polypropylene and carbon kneaded in the polypropylene, a silicone resin, a synthetic resin with a vapor-deposited metal, glass with a vapor-deposited metal, rubber and carbon kneaded in the rubber, or a monocrystalline silicon substrate.

13. The eddy current sensor according to claim 8, wherein the electrically conductive member is formed by containing a material having an electrical resistivity of 1 $\Omega\cdot$cm to 100 $\Omega\cdot$cm.

14. The eddy current sensor according to claim 8, further comprising a magnetic shield sheet disposed between the sensor coil and the electrically conductive member and having an opening facing the sensor coil.

15. The eddy current sensor according to claim 8, wherein the eddy current sensor is an eddy current sensor for a polishing device, the eddy current sensor being provided in a hole formed in a polishing table to which a polishing pad for polishing a polishing target object is attached, the eddy current sensor being adapted to measure the distance to the polishing target object or the film thickness of the polishing target object, wherein the sensor coil generates an eddy current in the polishing target object and detects an induced magnetic field derived from the generation of the eddy current, and wherein the electrically conductive member is disposed on the polishing target object side of the sensor coil.

16. The eddy current sensor according to claim 15, wherein the electrically conductive member is disposed between the sensor coil and the polishing pad.

17. The eddy current sensor according to claim 15, wherein the electrically conductive member has an opposed portion opposed to the sensor coil and a peripheral portion connected to the opposed portion and facing an inner wall surface of the hole formed in the polishing table.

* * * * *